(12) United States Patent
Kimoto

(10) Patent No.: US 7,939,904 B2
(45) Date of Patent: May 10, 2011

(54) SEMICONDUCTOR DEVICE AND METHOD OF MANUFACTURING THE SAME

(75) Inventor: Kenji Kimoto, Tsukuba (JP)

(73) Assignee: Sharp Kabushiki Kaisha, Osaka (JP)

( * ) Notice: Subject to any disclaimer, the term of this patent is extended or adjusted under 35 U.S.C. 154(b) by 149 days.

(21) Appl. No.: 12/324,449

(22) Filed: Nov. 26, 2008

(65) Prior Publication Data

US 2009/0173973 A1 Jul. 9, 2009

Related U.S. Application Data

(62) Division of application No. 11/451,422, filed on Jun. 13, 2006, now Pat. No. 7,525,171.

(30) Foreign Application Priority Data

Jun. 13, 2005 (JP) ................ P2005-172088

(51) Int. Cl.
*H01L 27/095* (2006.01)

(52) U.S. Cl. ........ 257/471; 257/476; 257/486; 257/651; 257/E29.015; 257/E29.148

(58) Field of Classification Search .................. 257/471, 257/475, 476, 485, 486, 645, 651, E29.015, 257/E29.041, E29.148, E29.178
See application file for complete search history.

(56) References Cited

U.S. PATENT DOCUMENTS 5,471,081 A * 11/1995 Fishbein et al. .............. 257/356

FOREIGN PATENT DOCUMENTS

JP 10-209445 A 8/1998

OTHER PUBLICATIONS

C. Wang et al., Applied Physics Letters, 1999, pp. 1174-1176, vol. 74.

* cited by examiner

*Primary Examiner* — Matthew E Warren
(74) *Attorney, Agent, or Firm* — Birch, Stewart, Kolasch & Birch, LLP

(57) ABSTRACT

A semiconductor device has a semiconductor (e.g., a silicon substrate), an electrically conductive region (e.g., a source region and a drain region) which is in contact with the semiconductor to form a Schottky junction, and an insulator. The insulator is in contact with the semiconductor and the electrically conductive region, and has a fixed-charge containing region which contains a fixed charge and extends across a boundary between the semiconductor and the electrically conductive region.

29 Claims, 14 Drawing Sheets

SEMICONDUCTOR DEVICE AND METHOD OF MANUFACTURING THE SAME

CROSS-REFERENCE TO RELATED APPLICATIONS

This application is a Divisional of application Ser. No. 11/451,422, filed on Jun. 13, 2006 now U.S. Pat. No. 7,525,171, the entire contents of which are hereby incorporated by reference and for which priority is claimed under 35 U.S.C. §120. This nonprovisional application claims priority under 35 U.S.C. §119(a) on Patent Application No. 2005-172088 filed in Japan on Jun. 13, 2005, the entire contents of which are hereby incorporated by reference.

BACKGROUND OF THE INVENTION

The present invention relates to a semiconductor device and a method of manufacturing the semiconductor device.

In general, a Schottky barrier is formed at the interface between a semiconductor and metal. Because of this, carrier conduction from the metal to the semiconductor is caused by the thermionic emission that carriers go beyond the Schottky barrier by thermal energy, or the tunnel effect that carriers tunnel through the Schottky barrier due to the quantum-mechanical effect, and the amount of the current is heavily dependent on the height and width of the Schottky barrier.

As an example of devices using such a Schottky barrier, a Schottky barrier metal insulator semiconductor (MIS) field-effect transistor (referred to as SB-MISFET hereinafter) has been proposed.

FIG. 13 is a cross-sectional view of a conventional SB-MISFET.

This SB-MISFET has, as shown in FIG. 13, a gate insulating film 103 formed on a silicon substrate 101, a gate electrode 104 formed on the gate insulating film 103, and a source region 110 and a drain region 111 which are made of metal or metallic silicide (for example, PtSi, CoSi$_2$, or the like) and are formed to self-align with respect to the gate electrode 104.

In the SB-MISFET configured as above, since the source region 110 and the drain region 111 have been made of metal or metallic silicide, a Schottky barrier is formed between the source region 110 and the silicon substrate 101, and between the drain region 111 and the silicon substrate 101. When an ON-state voltage is applied to the gate electrode 104, band bending occurs in the silicon substrate 101, and the heights and widths of the Schottky barriers are effectively reduced. Because of this, carrier conduction from the source region 110 to the channel region is caused by the thermionic emission, tunnel effect, or the like, and the transistor operation is thus realized.

Furthermore, since the source region 110 and the drain region 111 have been made of metal or metallic silicide, they are able to have much lower resistances than a source region and a drain region which are formed by impurity doping into a semiconductor as used in an ordinary MIS field-effect transistor. Furthermore, since the depths of the Schottky junctions can be reduced quite easily by reducing the thickness of metal to be deposited, or by controlling the reaction between the metal and the silicon substrate, it is also expected to suppress the short channel effect. For this reason, it is expected that a high performance transistor will be provided by using an SB-MISFET in which the depths of the junctions and the parasitic resistance are reduced.

However, the heights and widths of the Schottky barriers are substantially determined by the difference between the electron affinity of the semiconductor and the work function of the metallic material, so that it is very difficult to control the carrier conduction from the metal to the semiconductor. For example, when silicon is used as the semiconductor, a metal-silicide is usually formed to obtain a good metal-semiconductor interface. And, when an ordinary large scale integrated circuit (LSI) is manufactured, metal used for the silicide is generally Ti, Co, Ni, or the like. Thus, there is a low degree of flexibility in selecting metallic material, and therefore the heights and widths of the Schottky barriers cannot be controlled freely.

Thus, in the SB-MISFET cited as an example of the background art, the height and width of the Schottky barrier between the source region and the channel region, on which the threshold voltage is dependent, are heavily dependent on metallic material used for the source region, so that the threshold voltage cannot be controlled freely. The source region and the drain region of the SB-MISFET are usually made using salicide (i.e., self-aligned silicide) process, and in order to prevent shorts between the gate region and the source/drain region, taking measures such as forming gate sidewall films (e.g., S$_i$O$_2$) having a sufficient thickness is required before the salicide process to increase the distance between the gate region and the source/drain region, a region between which is exposed for providing silicide.

At the same time, in order to suppress the short channel effect, the depth of the junction between the metallic silicide and the silicon substrate is required to be reduced by controlling the reaction between the metal and the silicon substrate. The amount of horizontal reaction of the silicide is as much as or less than the amount of in-depth reaction of it, so that an offset is easy to arise between the channel region and the source/drain region. If an offset arises, deterioration of the ON-state current caused by increase of the threshold voltage and/or increase of the parasitic resistance, decrease of the yield caused by increase of the threshold voltage variation, etc. become problems.

Furthermore, when an n-type device and a p-type device are fabricated on a substrate as in a complementary MIS (CMIS) field-effect transistor, etc., it is preferable that the source region and drain region of the n-type device are made of the same metallic material as one used for the source region and drain region of the p-type device in order to reduce the number of manufacturing processes. In this case, in order that the threshold voltage of the n-type device is as large as that of the p-type device, a metal used for the source region and drain region is selected from materials having a Fermi level near the middle of the forbidden band of the semiconductor. However, in this case, the heights of the Schottky barriers become as large as one-half of the energy gap of the semiconductor (about 1.1 eV in the case of silicon), so that it is difficult to obtain a sufficient large ON-state current.

SUMMARY OF THE INVENTION

The present invention has been developed in order to solve the problems described above, and has an object to provide a semiconductor device and a method of manufacturing it, in which the heights and widths of the Schottky barriers can be controlled easily regardless the kind of the metallic material, and when the semiconductor device is a field-effect transistor or the like in which Schottky barriers are used, the short channel effect of the device can be controlled effectively without significantly increasing the parasitic resistance.

In order to accomplish the object, a semiconductor device according to a first aspect of the present invention includes:
a semiconductor;

an electrically conductive region which is in contact with the semiconductor to form a Schottky junction; and an insulator layer which is in contact with the semiconductor and the electrically conductive region, and has a fixed-charge containing region which contains a fixed charge and extends across a boundary between the semiconductor and the electrically conductive region.

In this specification, "fixed charge" means a positively or negatively charged state, substances in a positively or negatively charged state, or the like, which do not substantially move in operations in a practical temperature domain of the semiconductor device according to the present invention. For example, the fixed charge may be a charged state caused by strain, defect, or the like in a crystal; a charged state caused by strain, loss, or the like in interatomic bonds; positively or negatively charged atoms, molecules, fine particles, or microcrystallites; a positively charged state caused when electrons are emitted from a donor level made by a impurity or the like; a state caused by a negatively charged state obtained when electrons are captured at an acceptor level, or the like.

In the semiconductor device configured as above, the insulator has a fixed-charge containing region near a region where the insulator is in contact with the Schottky junction, so that bands of the semiconductor near the Schottky junction are bent, and the height and width of the Schottky barrier are thus modulated. For example, the height and width of the Schottky barrier are reduced with respect to electrons if the polarity of the fixed charge is positive, and with respect to holes if the polarity of the fixed charge is negative. When the fixed-charge density is sufficiently large, a carrier conduction layer which is either an inversion layer or an accumulation layer is formed at the surface of the semiconductor under the fixed-charge containing region, according to the conductivity type of the Schottky junction semiconductor and the polarity of the fixed charge.

For example, when the conductivity type of the semiconductor is p-type and the polarity of the fixed charge is negative, or when the conductivity type of the semiconductor is n-type and the polarity of the fixed charge is positive, an accumulation layer is formed, and the height and width of the Schottky barrier against carries in the accumulation layer are modulated so as to be reduced, so that the electrical resistance between the semiconductor and the electrically conductive region can be reduced, and an ohmic contact may also be formed.

Furthermore, when the conductivity type of the semiconductor is n-type and the fixed charge is negative, or when the conductivity type of the semiconductor is p-type and the fixed charge is positive, an inversion layer is formed, and the height and width of the Schottky barrier against carries in the inversion layer are modulated so as to be reduced, so that the electrical resistance between the inversion layer and the electrically conductive region can be reduced, and the inversion layer and the electrically conductive region may be ohmically coupled.

Consequently, the height and width of the Schottky barrier formed between the electrically conductive region and the semiconductor can be modulated easily and freely by controlling the fixed-charge density. Furthermore, the short channel effect in a field-effect transistor or the like in which Schottky barriers are used can be controlled effectively without significantly increasing the parasitic resistance.

In one embodiment, the semiconductor device further includes a gate electrode, and wherein:

the electrically conductive region includes a source region and a drain region provided on one principal plane of the semiconductor and spaced from each other;

the insulator includes a gate insulating film under the gate electrode and a first insulating layer provided on opposite sides of the gate insulating film in such a manner that the first insulating layer overlaps the source region and the drain region;

the fixed-charge containing region is contained in opposite end portions of the gate insulating film and portions of the first insulating layer adjacent to those opposite end portions of the gate insulating film;

the fixed charge of the insulator has a polarity equivalent to a conductivity type of the semiconductor; and the gate electrode is provided, via the gate insulating film, on a channel region of the semiconductor between the source region and the drain region as well as on a portion near the channel region of at least one of the source region and the drain region.

In the semiconductor device configured as above, the source region and the drain region serve as the electrically conductive regions for forming Schottky junctions between the semiconductor and them. Then, the semiconductor device is constituted as an SB-MISFET in which the gate electrode is positioned such that it overlaps the source region and/or the drain region. Also, there are fixed-charge containing regions having the same polarity as the conductivity type of the semiconductor near regions where the channel region is in contact with the source region and the drain region. Therefore, the bands of the semiconductor under the fixed-charge containing regions are bent, and thereby the heights and widths of the Schottky barriers between the channel region and the source region and between the channel region and the drain region are modulated to be reduced. Consequently, controlling the fixed-charge density enables the threshold voltage of the SB-MISFET to be controlled freely without being limited by the work function of a material used for the source region and the drain region.

In another embodiment, the fixed-charge containing region is contained in at least the first insulating layer such that the fixed-charge containing region extends at least from each of positions corresponding to two opposed side surfaces of the gate electrode to a position on each of the source and drain regions.

In the semiconductor device of this embodiment, at least the first insulating layer on the semiconductor between the gate electrode and each of the source region and the drain region has the fixed-charge containing regions which contain fixed charges having a polarity equivalent to the conductivity type of the semiconductor, so that the bands of the semiconductor under the fixed-charge containing regions are bent to form inversion layers. Furthermore, since the heights and widths of the Schottky barriers separating the inversion layers from the source region and drain region are reduced, the inversion layers and the source region and drain region are connected so as to have low resistances therebetween, and the inversion layers thus function as source and drain extensions that effectively have extremely shallow junctions. Since the inversion layers are used as the source and drain extensions as described above, the junctions have effectively extremely shallow depths, and thereby a MIS field-effect transistor in which the short channel effect can be controlled effectively can be realized. Furthermore, since the source region and the drain region can be made of a compound of the semiconductor and metal without being doped with an impurity such as As, P, or B in a high concentration, shallow junctions are easily formed, and the short channel effect characteristic is thus easily improved. In addition, since the source region and the drain region are made of a compound of the semiconductor and metal, extremely high temperature annealing such as flash lamp annealing or laser annealing is not required for the activation of the impurity in the source region and drain region, and therefore problems such as deterioration of the characteristic of the gate insulating film, melting of the gate electrode, and strains and breakages of a semiconductor substrate can be avoided, and also, the energy consumption for the manufacturing can be reduced.

In one embodiment, an interface between the fixed-charge containing region of the first insulating layer and the semiconductor is provided in a semiconductor-side deeper position than an interface between the gate insulating film and the semiconductor.

In the semiconductor device of this embodiment, the interface between the fixed-charge containing region of the first insulating layer and the semiconductor is provided in a position far from the gate electrode, so that the electric lines of force emitted from the fixed charges near the interface are restrained from terminating at the gate electrode, and the electric lines of force are thus allowed to terminate at the semiconductor. Consequently, the bands of the semiconductor can be bent effectively by the fixed charges, and the height and width of the Schottky barrier can be thus modulated easily.

In one embodiment, the fixed charge is constituted by a substance. And, the semiconductor device further includes a second insulating layer on the fixed-charge containing region of the first insulating layer, said second insulating layer being made of a substance in which the substance constituting the fixed charge is less heat-diffusible than in the first insulating layer.

In the semiconductor of this embodiment, out-diffusion of the substance constituting the fixed charge, which would be caused by a thermal process such as annealing, can be prevented by the second insulating layer. Consequently, the fixed charge can be generated effectively.

In one embodiment, the fixed charge is constituted by a substance, and the gate insulating film is made of a material which is resistant to thermal diffusion of the substance constituting the fixed charge of the first insulating layer.

In the semiconductor device of this embodiment, it is possible to prevent disadvantages such as variation of threshold voltage and the deterioration of the mobility of carriers in the channel caused by the diffusion of the substance constituting the fixed charge toward a central part of the gate insulating film (i.e., a part of the gate insulating layer other than the first insulating layer-side end portions thereof) during a thermal process such as annealing.

In one embodiment, the fixed-charge containing region of the first insulating layer has a thickness larger than a thickness of the gate insulating film.

In the semiconductor device of this embodiment, the cross-sectional area of the insulator under the gate electrode viewed from the fixed-charge containing region is smaller, so that the substance constituting the fixed charge is restrained from entering the central part of the gate insulating film (i.e., a part of the gate insulating layer other than the first insulating layer-side end portions thereof) by thermal diffusion caused by a thermal process such as annealing.

In one embodiment, the semiconductor is provided on an insulator layer.

In the semiconductor device of this embodiment, the parasitic capacitance can be reduced and/or the S (subthreshold swing) value can be improved (i.e., reduced), and thus the operation speed of the device can be increased. Furthermore, since there are Schottky junctions in the source region and the drain region, there will hardly occur characteristic fluctuations caused by the floating body effect which becomes a problem when the semiconductor becomes an electrical floating state.

In one embodiment, the electrically conductive region is in contact with the insulator layer.

In the semiconductor device of this embodiment, the parasitic capacitance can be reduced. Thus, increase of the operation speed of the device and reduction of the power consumption can be realized.

In one embodiment, the electrically conductive region is made of a compound of the semiconductor and metal.

In the semiconductor of this embodiment, the consistency of the interatomic bonds at an interface between the electrically conductive region and the semiconductor is better than that in the case of using a metal for the electrically conductive region. Thus, Schottky junction having a good rectification characteristic can be realized.

Furthermore, in an embodiment, the metal is any one of tungsten, titanium, cobalt, nickel, and palladium.

In the semiconductor of this embodiment, any one of tungsten, titanium, cobalt, nickel, and palladium is used as the metal, so that metallic silicide can be formed easily.

In one embodiment, the semiconductor has a conductivity type of p-type, and the metal is any one of erbium and ytterbium.

In the semiconductor device of this embodiment, erbium or ytterbium is used as the metal, so that the Schottky barrier against electrons can be reduced, and thereby the resistance between the electrically conductive region and the semiconductor can be reduced.

In one embodiment, the semiconductor has a conductivity type of n-type, and the metal is platinum.

In the semiconductor of this embodiment, platinum is used as the metal, so that the Schottky barrier against holes can be reduced. Because of this, the resistance between the electrically conductive region and the semiconductor can be reduced.

In one embodiment, the semiconductor has a conductivity type of p-type, and at least one element of cesium, rubidium, barium, and strontium constitutes the fixed charge.

In the semiconductor of this embodiment, positive fixed charges can be obtained easily, because cesium, rubidium, barium, and strontium have relatively small first ionization energies as well as relatively large ion radii, among the elements in the periodic table.

In one embodiment, the semiconductor has a conductivity type of n-type, and at least one element of iodine, aluminum, platinum, and selenium constitutes the fixed charge.

In the semiconductor of this embodiment, negative fixed charges can be obtained easily, because, among the elements in the periodic table, iodine has a relatively large affinity as well as a relatively large ionic radius, platinum and selenium have a relatively large work function, and aluminum easily assumes a negative charge in an insulating film made of, for example, silicon oxide or the like.

A method of manufacturing a semiconductor device, according to a second aspect of the present invention, includes steps of:

forming an insulating layer on a semiconductor;

introducing a substance to become a fixed charge into the insulating layer;

forming a semiconductor exposure region by removing part of the insulating layer, into which the substance to become the fixed charge has been introduced; and forming an electrically conductive region in the semiconductor exposure region, the electrically conductive region being in contact with the semiconductor to form a Schottky junction.

In the semiconductor manufacturing method, the height and width of the Schottky barrier formed between the electrically conductive region and the semiconductor can be modulated easily and freely by controlling the fixed-charge density. Furthermore, when the semiconductor device is a field-effect transistor or the like in which Schottky barriers are used, the short channel effect of it can be controlled effectively without significantly increasing the parasitic resistance. Furthermore, after the substance to form the fixed-charge containing region has been introduced into the insulating layer, part of the insulating layer is removed to expose a part of the semiconductor, and the electrically conductive region is then formed, so that the electrically conductive region and the fixed-charge containing region are formed without arising any offset from each other. Furthermore, the substance to become fixed-charges is prevented from being introduced into the electrically conductive region, and therefore the Schottky junction characteristic is not adversely affected.

In one embodiment, the semiconductor device manufacturing method further includes an annealing step after the step of introducing the substance to become the fixed charge into the insulating layer and before the step of forming the semiconductor exposure region.

In the semiconductor manufacturing method of this embodiment, an annealing process is carried out after the substance to form the fixed-charge containing region is introduced into the insulating layer, so that the substance to form fixed-charge containing region is redistributed to a region closer to the semiconductor by thermal diffusion, thus generating fixed charges effectively. Furthermore, since the annealing process is carried out before removing part of the insulating layer to form the semiconductor exposure region, the annealing process causes little contamination of the semiconductor.

In one embodiment, the step of forming the electrically conductive region includes forming an electrically conductive compound by a chemical reaction of the semiconductor with metal.

In the semiconductor device manufacturing method of this embodiment, the chemical reaction of the semiconductor with the metal proceeds not only in the in-depth direction but also in the horizontal, or lateral direction, so that the electrically conductive region is formed so as to overlap the fixed-charge containing region. Consequently, the fixed-charge containing region can be provided in the area of contact between the Schottky junction and the insulating layer with a sufficient margin of error, and thus a possible variation of the modulation amount of the Schottky barrier can be extremely suppressed. Because of this, devices having little variation characteristic can be obtained.

In one embodiment, the semiconductor device manufacturing method further includes a step of forming a gate electrode via a gate insulating film on the semiconductor before the step of forming the insulating layer.

In the semiconductor device manufacturing method of this embodiment, the insulating layer into which fixed charge is to be introduced is formed after the gate insulating film and the gate electrode have been formed, so that not only can the thickness of the gate insulating film and the thickness of the insulating layer be controlled independently, but also the device can be manufactured without problems, such as giving damage to the gate insulating film, caused by a subsequent steps such as the step of introducing the substance to become fixed charges into the insulating film.

In one embodiment, the step of forming the insulating layer includes forming an insulative compound by a chemical reaction of the semiconductor with gas including at least one of oxygen, nitrogen monoxide, and dinitrogen monoxide.

In the semiconductor device manufacturing method of this embodiment, for example, if silicon is used for the semiconductor, the insulating layer can be made of silicon oxide or silicon oxynitride, so that the mobility of the carrier conduction layer induced by the fixed charges can be increased. Furthermore, the interface between the insulating layer and the semiconductor is formed in a deeper position than the surface of the semiconductor at a time preceding the chemical reaction. Therefore, it can be easily achieved to place the interface between the insulating layer and the semiconductor in a deeper position than the interface between the gate insulating film and the semiconductor.

In one embodiment, the semiconductor exposure region is formed in a self-aligned manner with respect to the gate electrode.

In the semiconductor device manufacturing method, because the electrically conductive region is formed in the semiconductor exposure region which has been formed in a self-aligned manner with respect to the gate electrode, the electrically conductive region is also formed in a self-aligned manner with respect to the gate electrode. Consequently, the electrically conductive region can be formed without being affected by the discrepancy in alignment caused by the lithography, so that an excess dimensional margin is not required and the device area is thus reduced. Furthermore, electrically conductive regions to become a source region and a drain region can be formed in positions which are generally symmetric with respect to the gate electrode, so that a good device characteristic is easily obtained, and in particular when the semiconductor device is a pass transistor, a good device characteristic which is not dependent on the input direction can be obtained easily.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Semiconductor devices according to the present invention and methods of manufacturing them will be described in detail below with reference to the embodiments shown in the figures.

A semiconductor substrate which may be used in the present invention is preferably but not limited to a single-crystal silicon substrate. In addition, a semiconductor-on-insulator (SOI) substrate or a strained semiconductor substrate in which the carrier mobility is increased by adding a strain to the crystal may be used. Furthermore, a polycrystalline semiconductor or amorphous semiconductor formed on a glass substrate or the like may be used. In the following embodiments, description will be made with particular emphasis on an n-type channel device in which cesium is used for the fixed charge, but a p-type channel device may be formed by reversing the conductivity type of the impurity and the polarity of the fixed charge. As a matter of course, both of an n-type channel device and a p-type channel device may be formed on one substrate.

First Embodiment

The semiconductor device of the first embodiment of the present invention is a Schottky-barrier-source/drain MIS field-effect transistor which is so structured that the source region and drain region made of metallic material overlap the gate electrode, wherein fixed charges are generated by doping cesium into an insulating film provided on a region of the substrate where the channel region is in contact with the source region and on a region of the substrate where the channel region is in contact with the drain region, thereby realizing the control of the threshold voltage as intended. That is, the semiconductor device of the first embodiment has a gate electrode, which is provided on the channel region of the semiconductor between the source region and the drain region, on a portion of the source region near the channel region, and on a portion of the drain region near the channel region, via a gate insulating film which has, at its end portions, regions containing fixed charges.

FIGS. 1A to 1E are cross-sectional views of the semiconductor device of the first embodiment of the present invention during the manufacturing process for illustrating the manufacturing method of the semiconductor device.

Figure 1A:
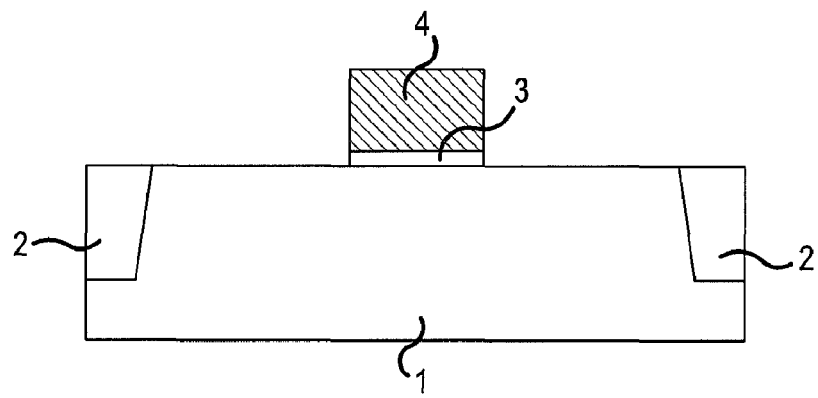
FIGS. 1A, 1B, 1C, 1D and 1E show the processes of manufacturing a semiconductor device of a first embodiment of the present invention.

At first, as shown in FIG. 1A, device isolation regions 2 are formed on one principal surface of a p-type silicon substrate 1 as an example of a semiconductor by, for example, a shallow trench isolation (STI) method, and a device forming region is defined by the device isolation regions 2. Next, a polycrystal silicon film is deposited on a gate insulating film 3 made of silicon oxide provided on the surface of the device forming region, and a gate electrode 4 is then formed by patterning of the polycrystal silicon film.

The material of the gate insulating film 3 may be anything as long as it has an insulating performance, and may be an insulating material having a dielectric constant higher than silicon oxide, such as hafnium oxide, zirconium oxide, or alumina, or may be an insulating material which contains nitrogen of the order of 30% or less in composition, such as silicon oxynitride or hafnium oxynitride. Furthermore, although polycrystal silicon is used for the gate electrode 4 in this embodiment, amorphous silicon, amorphous silicon germanide, polycrystal silicon germanide or the like may be used. Furthermore, the gate electrode 4 may have been doped in n-type with phosphorus, arsenic, antimony, or the like. In the case of a p-type device, the gate electrode may have been doped in p-type with boron, boron fluoride, or the like.

An insulating layer (a first insulating layer) into which fixed charges are to be introduced is formed after the gate insulating film 3 and the gate electrode 4 have been formed, so that not only the thickness of the gate insulating film 3 and the thickness of the insulating layer can be controlled independently, but also the device can be manufactured without any problem such as giving damage to the gate insulating film 3 by a subsequent process such as the process of introducing a substance to become fixed-charge containing regions into the insulating film.

Figure 1B:
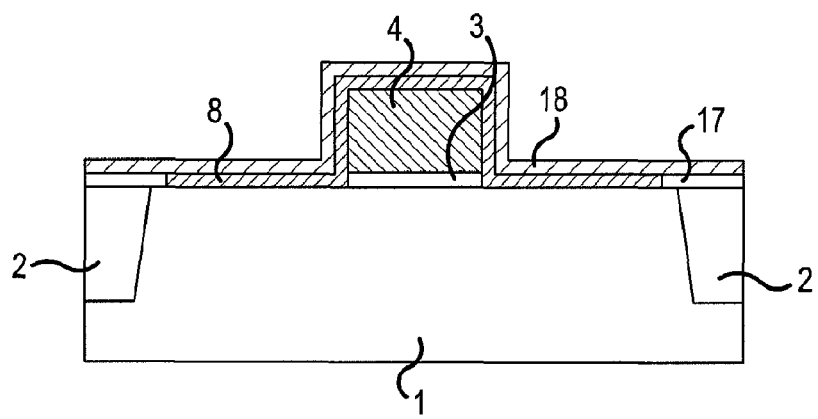

Next, as shown in FIG. 1B, a silicon oxide film 17 and a silicon nitride film 18 are deposited in succession by a chemical vapor deposition (CVD) method. After forming the silicon oxide film 17 and before forming the silicon nitride film 18, annealing may be carried out in an oxygen-containing atmosphere to grow a silicon oxide film at the interface between the silicon oxide film 17 and the silicon substrate 1. Because of the silicon oxide film, the mobility of an inversion layer formed below the interface between the silicon film 17 and the silicon substrate 1 can be increased, and the interface between the silicon oxide film 17 and the silicon substrate 1 can be placed in a deeper position than the interface between the gate insulating film 3 and the silicon substrate 1.

Next, after patterning is carried out so that the device isolation regions 2 are covered with resist (not shown), ion implantation of cesium into the silicon oxide film 17 is carried out, and the resist is then peeled off. Instead of the ion implantation, cesium may be introduced into a gas used in a CVD method, such as silane, oxygen or a mixture thereof, to make the silicon oxide film 17 to contain cesium when the silicon oxide film 17 is formed.

Next, annealing is carried out in, for example, a nitrogen atmosphere to cause thermal diffusion of the cesium to a portion of the gate insulating film 3 near an end of the source region 10 and a portion of the gate insulating film 3 near an end of the drain region 11. At this moment, the cesium is segregated at the interface between the silicon oxide film 17 and the silicon substrate 1. Like this, a fixed-charge containing region 8 which covers the gate electrode 4 and the regions on both sides of the gate electrode 4 is formed. The fixed-charge containing region 8 is formed in a self-aligned manner with respect to the gate electrode 4.

As described above, annealing is carried out after the ion implantation of cesium into the silicon oxide film 17 and before a process of forming a semiconductor exposure region, so that the cesium to form the fixed-charge containing region can be redistributed to regions closer to the semiconductor by thermal diffusion, thus generating fixed charges efficiently. Since the annealing process is carried out before the process of forming a semiconductor exposure region, a problem that the semiconductor is contaminated due to the annealing process hardly arises.

Furthermore, the insulating layer into which the fixed charges are introduced is formed after the gate insulating film 3 and the gate electrode 4 have been formed, so that not only the thickness of the gate insulating film 3 and the thickness of the insulating layer can be controlled independently, but also the device can be manufactured without any problem such as giving damage to the gate insulating film 3 by a subsequent process such as the process of introducing a substance to form the fixed-charge containing region into the insulating film.

Figure 1C:
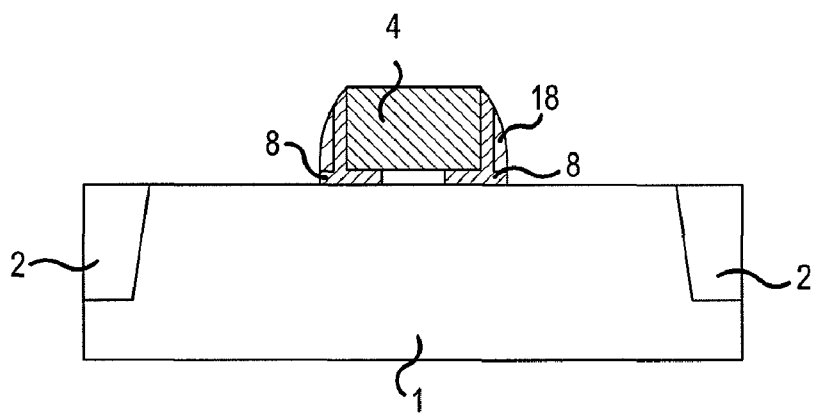

Next, as shown in FIG. 1C, gate sidewalls 18 are formed by etching back the silicon oxide film 17 (shown in FIG. 1B) and the silicon nitride film 18 (shown in FIG. 1B) by a reactive ion etching (RIE) method. As a result, the silicon substrate 1 is exposed in self-alignment with respect to the gate electrode 4.

Figure 1D:
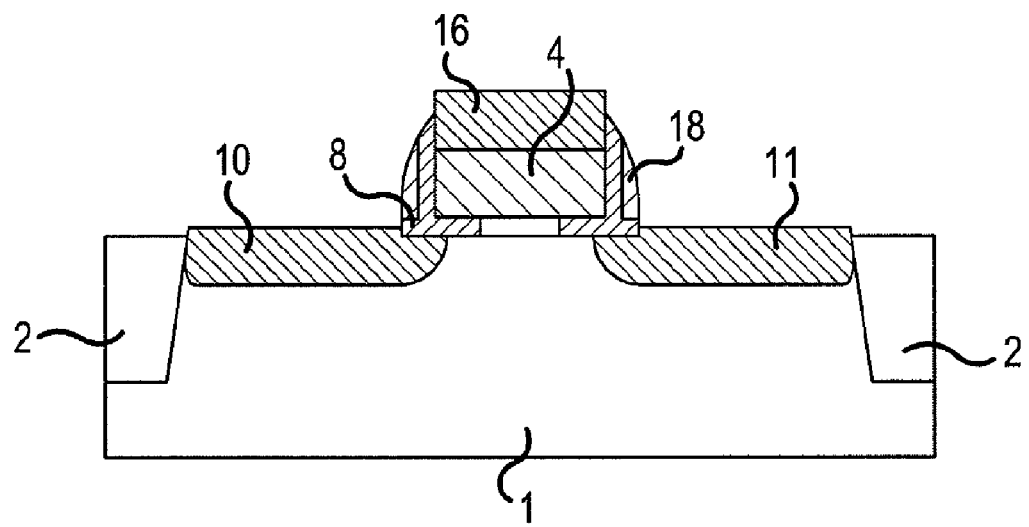

Next, as shown in FIG. 1D, a source region 10 and a drain region 11, which are made of metallic silicide and are an example of an electrically conductive region, are formed by a salicide (self-aligned silicide) process. At this moment, the metallic silicide is formed so that the source region 10 and the drain region 11 overlap the gate electrode 4. Between the metallic silicide (source region 10 and drain region 11) and the silicon substrate 1, Schottky junctions are formed. Since the silicon substrate 1 has been exposed in a self-aligned manner with respect to the gate electrode 4, the source region 10 and the drain region 11 are also formed in self-alignment with respect to the gate electrode 4. In other words, no lithography process is used, so that discrepancy in alignment caused by the lithography process can be avoided. In addition, the fixed-charge containing region 8 is also formed in positions self-aligned with respect to the gate electrode, thereby being positioned in self-alignment with respect to the source region 10 and drain region 11. Thus, a device characteristic with a small variation can be realized.

Furthermore, at this moment, a polycide 6 is formed on the top of the gate electrode 4. The gate electrode 4 may be made silicide completely.

As metallic material used for the metallic silicide, for example, W, Ti, Co, Ni, Pb, Pt, Er, Yb, or the like may be used. In particular, by using Er or Yb in the case of an n-type device, or by using Pt in the case of a p-type device, metallic silicide having a low Schottky barrier can be formed. Consequently, a lower threshold voltage can be obtained, thereby increasing the ON-state current of the device.

Figure 1E:
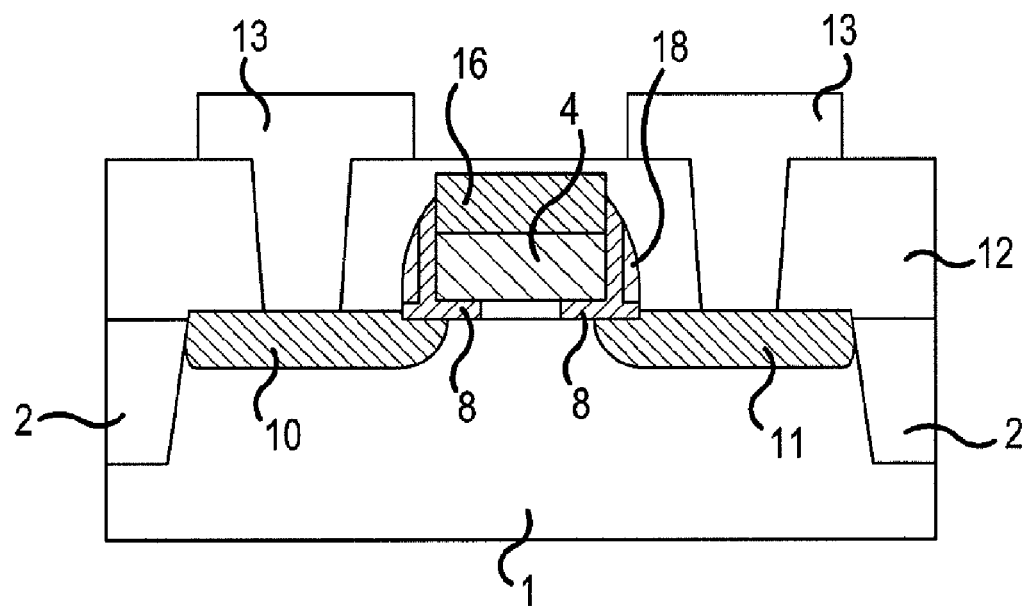

Next, as shown in FIG. 1E, interlayer dielectrics 12, upper wirings 13, etc. are formed by a publicly known method, and then the semiconductor device is completed.

Figure 2:
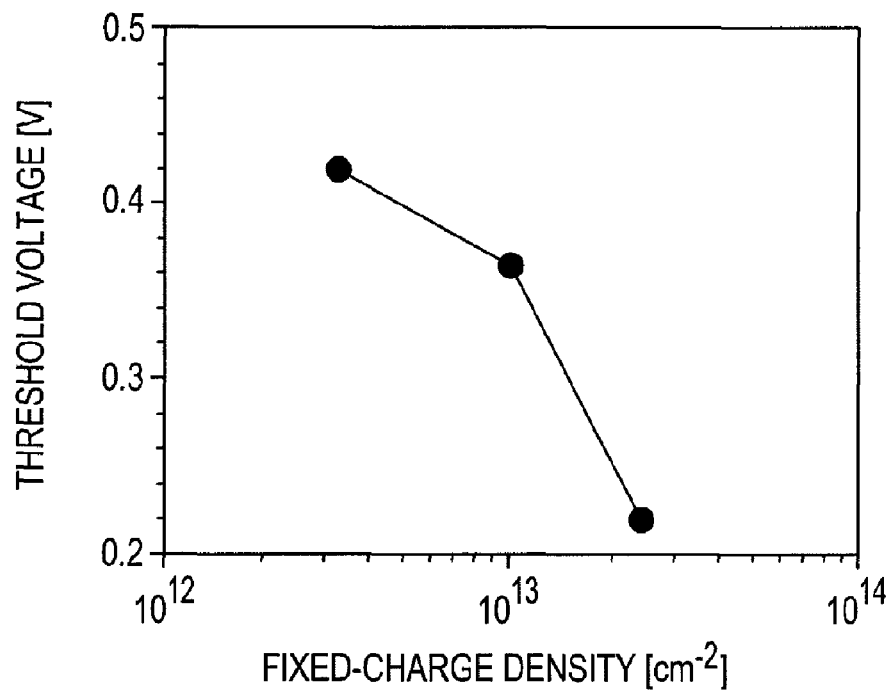
FIG. 2 shows the fixed-charge density dependence of the threshold voltage of the semiconductor device (n-type channel device) shown in FIG. 1E.

FIG. 2 shows the fixed-charge density dependence of the threshold voltage of the semiconductor device (n-type channel device) of the first embodiment, which was made using $CoSi_2$ as the metallic silicide, under the condition that the gate length was 50 nm, that the equivalent oxide thickness (EOT) of the gate insulating film 3 was 2 nm, and that the power supply voltage was 1.2 V. In FIG. 2, the horizontal axis indicates the fixed-charge density [$cm^{-2}$] and the vertical axis indicates the threshold voltage [V]. The fixed-charge densities were obtained in test samples made on the conditions corresponding to the above devices, by measuring the carrier densities by a four-terminal Hall effect measurement and adding the density of acceptors on the depletion layer to the measured carrier densities. As can be seen from FIG. 2, the threshold voltage can be controlled by controlling the fixed-charge density. The threshold voltage in the case that cesium was not doped was about 0.47 V, which is not shown in FIG. 2.

As can be seen from FIG. 1E, the semiconductor device of the first embodiment of the present invention is a MIS field-effect transistor having Schottky barrier source and drain, in which the source region 10 and the drain region 11 made of metallic silicide overlaps the gate electrode 4, and the gate insulating film 3 has cesium-containing regions 8 in its portions near the source region 10 and the drain region 11. By applying a voltage to the gate electrode 4, a channel region is formed in the silicon substrate 1 under the gate electrode 4, and at the same time the height and width of the Schottky barrier formed between the source region 10 and the silicon substrate 1 are modulated in an area of contact between the channel region and the source region 10. As a result of this, an electron flow from the source region 10 to the drain region 11 through the channel region arises. Since the cesium becomes positive fixed charge, electrical fields arise in the direction perpendicular to the interface between the silicon substrate 1 and the gate insulating film 3, in a portion of the channel region near an end of the source region 10 and in a portion of the channel region near an end of the drain region 11, and therefore the degree of band bending and the effect of modulation of the Schottky barriers become larger.

Consequently, by controlling the amount of cesium doped, it becomes possible to modulate the heights and widths of the Schottky barriers in a portion of the channel region near an end of the source region and in a portion of the channel region near an end of the drain region 11, and thus the threshold voltage can be controlled freely.

Figure 3:
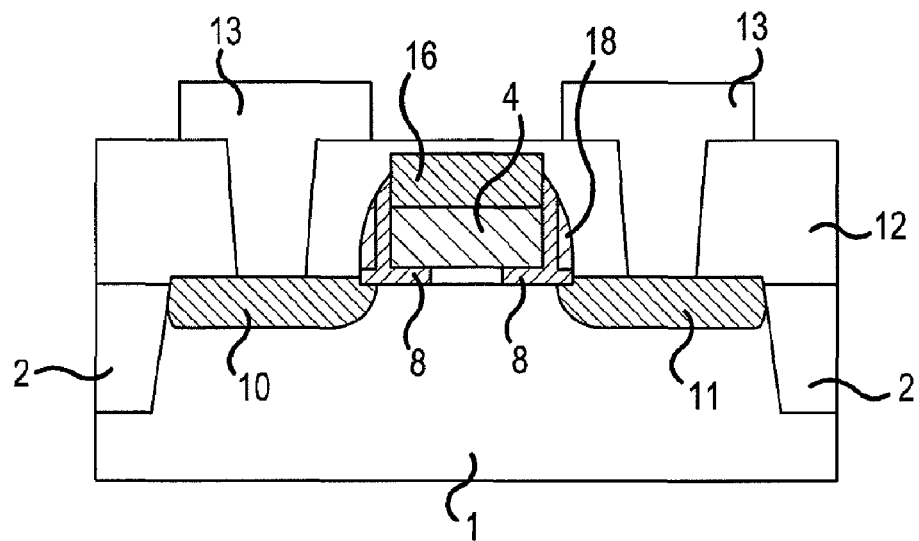
FIG. 3 shows that an offset arises between the source/drain region and the gate electrode of the semiconductor device shown in FIG. 1E due to variations in manufacturing.

Furthermore, the fixed-charge containing regions 8 containing cesium also lie on both sides of the gate electrode 4. Therefore, as shown in FIG. 3, even if the source region 10 and/or the drain region 11 does not overlap the gate electrode 4 due to the variations, etc. caused by the manufacturing processes, the threshold voltage and the parasitic resistance can be prevented from increasing, thereby the manufacturing variations of the device characteristic can be extremely reduced. In particular, this advantage is obtained very effectively when the region 8 on the source region 10 side has such a fixed-charge density or more that an inversion layer is formed even when the gate voltage is 0 [V].

In an experiment carried out by the inventor, whereas the yield in the case that cesium was not doped was about 72%, the yield in the case that cesium was doped and the fixed-charge density generated by the doping was $2.4 \times 10^{13}$ $cm^{-2}$ was about 93%, which displays a significant improvement.

Figure 4:
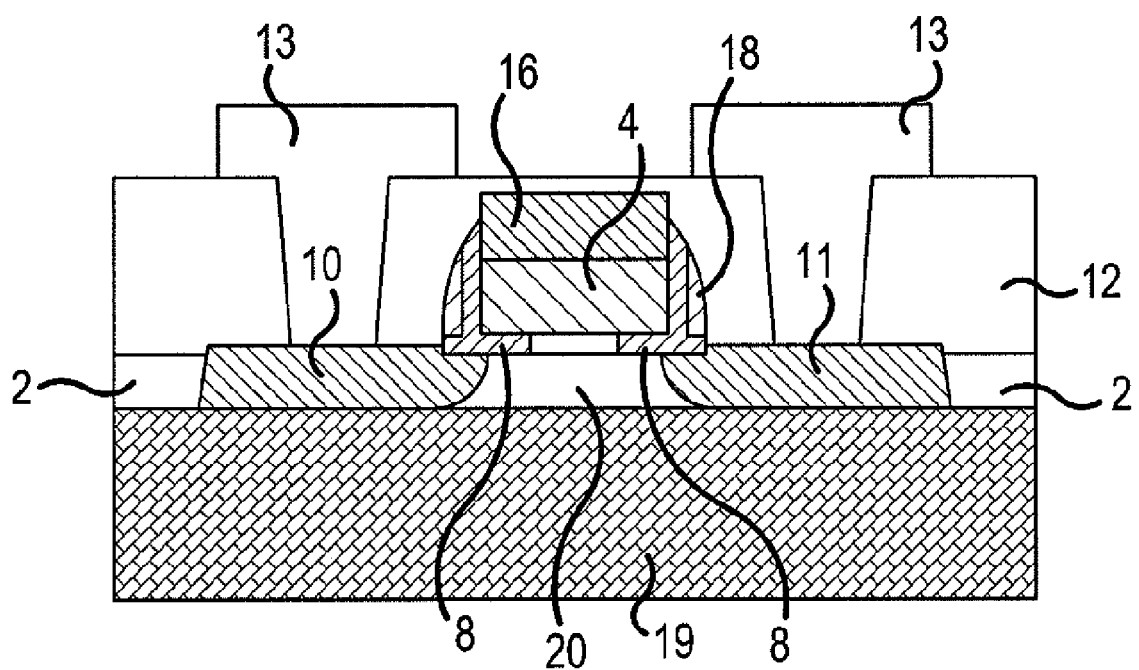
FIG. 4 is a cross-sectional view of a semiconductor device manufactured using a SOI substrate instead of the silicon substrate of the semiconductor device shown in FIG. 1E.

FIG. 4 is a cross-sectional view of a semiconductor device manufactured using a SOI substrate instead of the silicon substrate 1 of the semiconductor device shown in FIG. 1E. Since the source region 10 and the drain region 11 are in contact with a buried oxide film 19, the leakage currents and junction capacitances at the Schottky junctions can be significantly reduced. Furthermore, since there are Schottky junctions between each of the source region 10 and drain region 11 and a silicon layer 20, there hardly occurs the floating body effect which becomes a problem in a MIS field-effect transistor using a SOI substrate.

Below is described, using FIGS. 5A and 5B, a reason why the cesium near the interface between the silicon substrate 1 and the silicon oxide film 17 is ionized to become positive fixed charge.

Figure 5A:
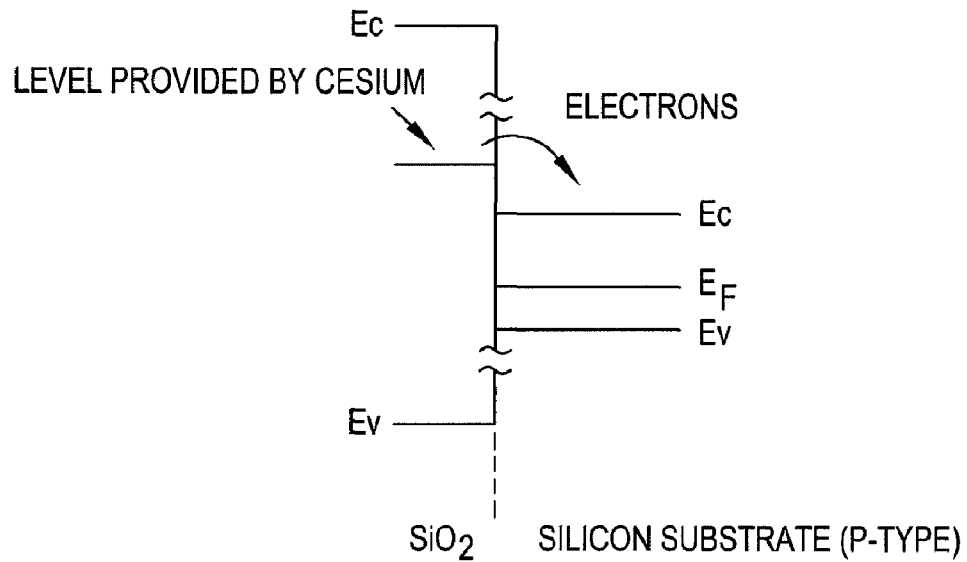
FIGS. 5A and 5B depict the principle on which cesium becomes fixed charge.
Figure 5B:
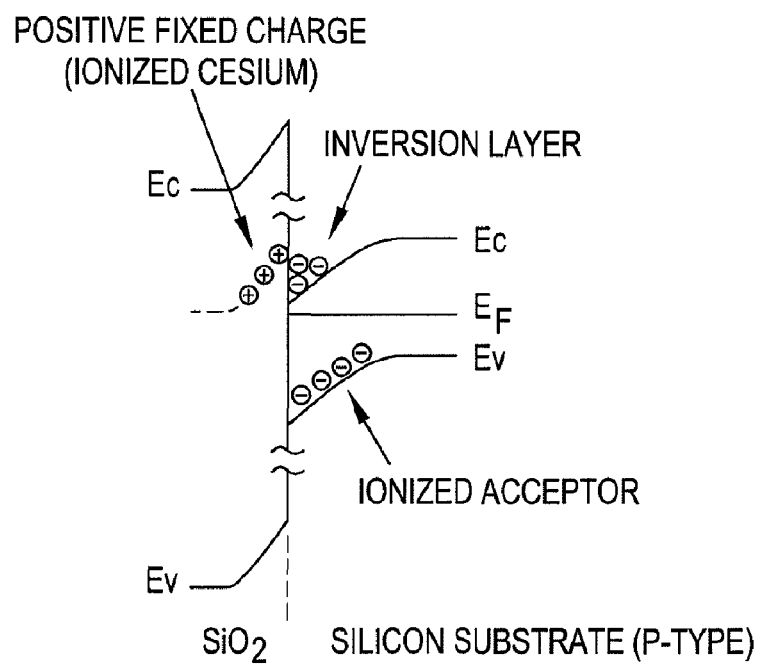

FIGS. 5A and 5B show the band diagrams viewed in the direction perpendicular to the interface between the p-type silicon substrate and the silicon oxide film formed on the p-type silicon substrate in the case that cesium is contained in the silicon oxide film. In the figures, $E_C$ indicates a lower end of the conduction band, $E_V$ indicates an upper end of the valence band, and $E_F$ indicates the Fermi level. FIG. 5A shows an initial state, and FIG. 5B shows a thermal equilibrium state.

As shown in FIG. 5A, the cesium in the silicon oxide film provides an energy level in the silicon oxide film. Since the first ionization energy of cesium (3.89 eV) is less than the electron affinity of silicon (4.15 eV), cesium is deemed to have an energy level in a position higher than the lower end of the conduction band of silicon. Thus, electrons are emitted from the cesium to the silicon substrate leading to a thermal equilibrium state.

As a result of this, as shown in FIG. 5B, the cesium is ionized to become positive fixed charges. The bands are bent near the interface between the silicon substrate and the silicon oxide film by the electrical field caused by the positive fixed charges, so that a depletion layer is formed in the silicon substrate near the interface between the silicon substrate and the silicon oxide film. When the fixed-charge density is sufficient, an inversion layer is formed. The bands are bent until the energy level of the neutral cesium positioned far from the silicon substrate becomes almost equal to the Fermi level of the silicon substrate. When the concentration of the cesium is $n_{Cs}$ [cm$^{-3}$], the ionization energy of the cesium in the silicon oxide film is $\chi_{Cs}$ [eV], and the electron affinity of the silicon substrate is $\chi_{Si}$ [eV], the surface density $\sigma_{fc}$ [cm$^{-2}$] of the cesium which is ionized to become fixed charges is given by:

$$\sigma_{fc} \approx \sqrt{\frac{2\varepsilon_0 \kappa_{SiO_2} n_{Cs}}{q}\left(\chi_{Si} + E_F + \frac{E_g}{2} - \chi_{Cs}\right)}$$

$$E_F = \frac{k_B T}{q}\ln\left(\frac{N_A}{n_i}\right)$$

where $\varepsilon_0$ is the dielectric constant of vacuum, $\kappa_{SiO_2}$ is the relative dielectric constant of the silicon oxide film, $E_g$ is the band gap of the silicon substrate, $E_F$ is the Fermi energy measured from the intrinsic level of the silicon substrate, $k_B$ is Boltzmann's constant, T is the absolute temperature, $N_A$ is the net acceptor concentration in the silicon substrate, $n_i$ is the intrinsic carrier density of silicon, and q is the elementary charge.

Consequently, the higher the concentration of the cesium is, the larger the fixed-charge density becomes, and if a material having a smaller ionization energy is used instead of cesium, a larger fixed-charge density is obtained. Furthermore, a larger fixed-charge density can be obtained by using a substance having a high dielectric constant instead of the silicon oxide film. A higher fixed-charge density can be obtained by distributing cesium or another impurity which becomes fixed charges in a higher concentration at a smaller distance from the silicon substrate, so that the impurity segregated at the interface between the silicon substrate and the silicon oxide can produce fixed charges efficiently.

Furthermore, while a substance having a small first ionization energy is preferable as an impurity used instead of cesium, a substance having an ionization energy $\chi$ satisfying:

$$\sigma_{fc} > 0 \Leftrightarrow \chi < \chi_{Si} + E_F + \frac{E_g}{2}$$

may be used. In addition, a substance is preferable which has a large ionic radius and is hard to become mobile ions in an insulating film such as a silicon oxide film in an ordinary device operating temperature range. For example, a substance having a small first ionization energy and a large ionic radius, like rubidium, barium, strontium, or the like, is preferable.

Furthermore, when the following relationship:

$$\sigma_{fc} > \sqrt{\frac{2\varepsilon_0 \kappa_{Si} N_A}{q}(2\phi_B + V_R)}$$

$$\phi_B = \frac{k_B T}{q}\ln\left(\frac{N_A}{n_i}\right)$$

is satisfied, inversion layers are formed in the silicon substrate under the fixed-charge containing regions 8. Therefore, even if the source region 10 and the drain region 11 are displaced with respect to the gate electrode 4, the variation of the device characteristic caused by the variation of the silicide process can be suppressed. In the above expressions, $\kappa_{Si}$ is the relative dielectric constant of silicon, and $V_R$ [V] is the reverse bias between the Schottky junctions that is applied to the source region 10 when the source region 10 side inversion layer is considered, or the reverse bias between the Schottky junctions that is applied to the drain region 11 when the drain region 11 side inversion layer is considered. For example, when $N_A$=1×10$^{18}$ [cm$^{-3}$] and $V_R$=0 [V], and $\sigma_{fc}$>3.5×10$^{12}$ [cm$^{-2}$] is satisfied, that is, $n_{Cs}$>2.2×10$^{18}$ [cm$^{-3}$] is satisfied, the inversion layers are formed.

In this connection, in the case of a p-type device, similar discussion can be done by substituting donors for the acceptors and substituting an electron affinity or a work function for the ionization energy. In other words, a substance having a larger electron affinity or work function is allowed to generate negative fixed charge more effectively. For example, iodine has a large electron affinity, and selenium and platinum have a large work function, so that they are allowed to generate negative fixed charges. Furthermore, negative fixed charges can be obtained by doping aluminum into the silicon oxide.

A principle and method of forming fixed charges is particularly not limited to the principle and method described above. For example, fixed charges may be formed by a method utilizing by the defect and/or interatomic bond in the insulating film.

Next, it will be explained using FIG. 6A to 6C that the height and width of a Schottky barrier are modulated by the fixed charge.

Figure 6A:
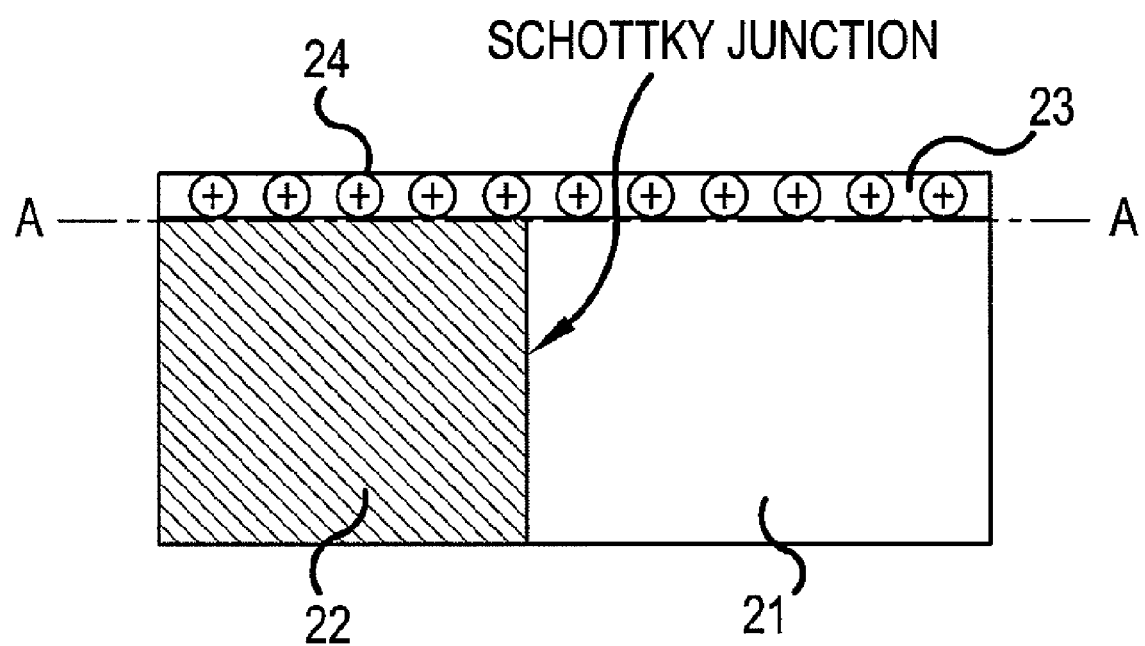
FIG. 6A is a schematic cross-sectional view depicting that a Schottky barrier is modulated by fixed charge.

FIG. 6A show a state that a p-type silicon substrate 21 is in contact with metal 22 via a Schottky junction, and fixed charges 24 are contained in an insulating film 23 formed on the surface.

Figure 6B:
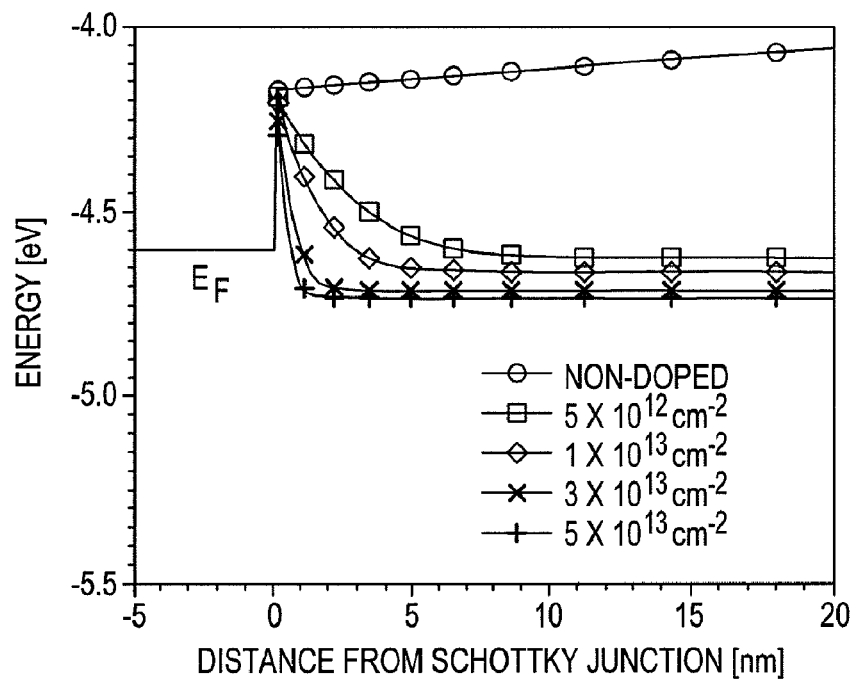
FIG. 6B shows the result of calculations at a lower end of a conduction band obtained along the line A-A shown in FIG. 6A.

FIG. 6B shows the result of calculations at the lower end of the conduction band obtained along the line A-A of FIG. 6A when the concentration of acceptors in the p-type silicon is 1×10$^{16}$ [cm$^{-3}$] and the work function of the metal is 4.6 eV. The numeric values of the legends indicate fixed-charge densities which are varied in the range of from 0 [cm$^{-2}$] to 5×10$^{13}$ [cm$^{-2}$]. In FIG. 6B, the horizontal axis indicates the distance [nm] from the Schottky junction (the distance measured along the silicon substrate), and the vertical axis indicates the energy [eV] from the vacuum level. As can be seen from FIG.

6B, the larger the fixed-charge density becomes, the smaller the width of the Schottky barrier becomes.

Figure 6C:
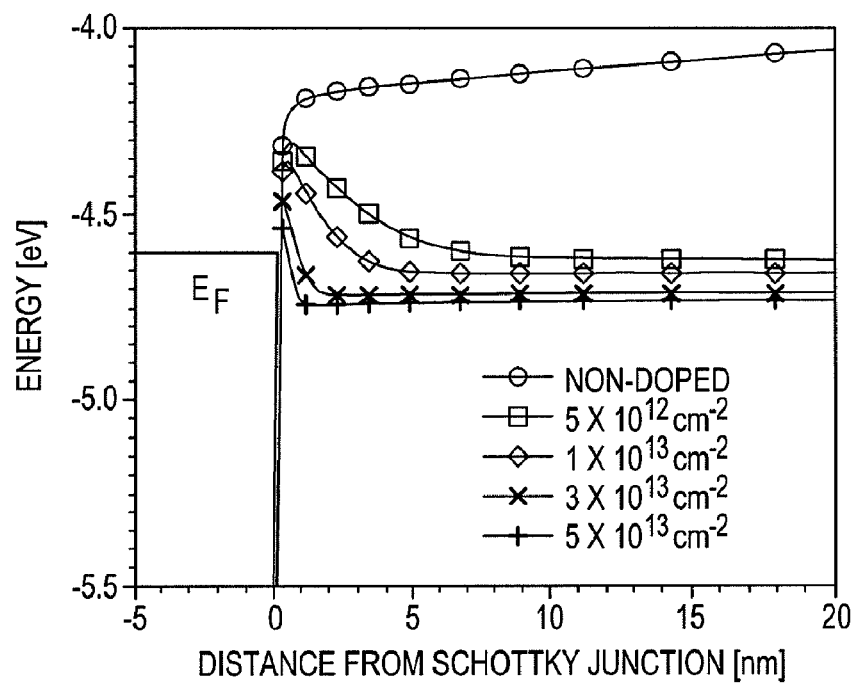
FIG. 6C shows the result of calculations in which an image potential is taken into consideration to the calculation result shown in FIG. 6B.

FIG. 6C shows a result of considering $$\phi = -\frac{q^2}{16\pi\varepsilon_0 \kappa_{Si} X}$$

as an image potential φ [eV] in the calculation result shown in FIG. 6B, where q is the elementary charge, $\varepsilon_0$ is the dielectric constant of vacuum, $\kappa_{Si}$ is the relative dielectric constant of silicon, and X is the distance from the Schottky junction (distance measured along the silicon substrate). As can be seen from FIG. 6C, the larger the fixed-charge density becomes, the smaller the width of the Schottky barrier becomes, and the smaller the height of the Schottky barrier becomes.

However, the Schottky barrier obtained taking φ into consideration in FIG. 6C is an overestimated one in the state of FIG. 6A, so that it can be considered that the actual lower end of the conduction band is between those in FIG. 6B and FIG. 6C. It is therefore recognized that the height and width of the Schottky barrier are modulated by controlling the fixed-charge density.

When electrons flow from the metal to the silicon, the electric current components mainly include a thermionic emission current generated when electrons go beyond the Schottky barrier by the thermal energy, and a tunnel current generated when electrons tunnel through the Schottky barrier by the quantum-mechanical effect. The thermionic emission current and the tunnel current increase when the height of the Schottky barrier is reduced due to the fixed charges, and the tunnel current increases when the width of the Schottky barrier is reduced due to the fixed charges. Consequently, the resistance caused by the Schottky barrier can be controlled by controlling the fixed-charge density, and thus free control of the threshold voltage of the Schottky-barrier-source/drain MIS field-effect transistor can be realized.

Second Embodiment

The semiconductor device of the second embodiment of the present invention is an n-type channel MIS field-effect transistor which has a source region and a drain region made of metallic material, and source and drain extensions consisting of inversion layers induced by fixed charge made of cesium, and which has been realized by simple processes. That is, the semiconductor device of the second embodiment has a gate electrode which is provided on the channel region of the semiconductor between the source region and the drain region via a gate insulating film, and both sides of the gate electrode are partially in contact with fixed-charge containing regions of an insulating layer. In this embodiment, the fixed-charge containing region extends from each of positions corresponding to two opposed side surfaces of the gate electrode to a position on each of the source and drain regions.

FIGS. 7A to 7E are cross-sectional views of the semiconductor device of the second embodiment of the present invention during the manufacturing process for illustrating the method of manufacturing it.

Figure 7A:
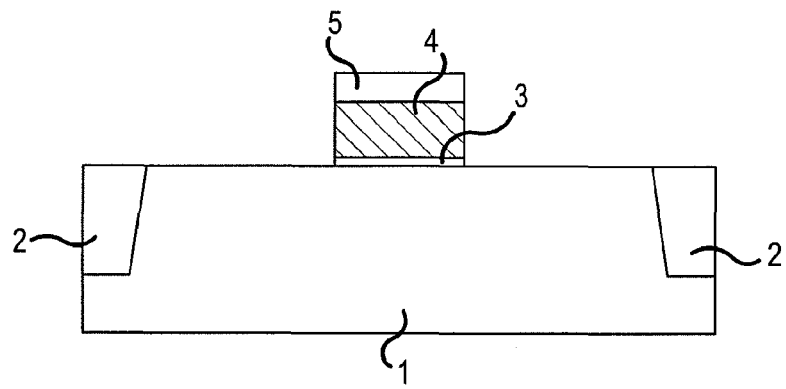
FIGS. 7A, 7B, 7C, 7D, 7E, and 7F show the processes of manufacturing a semiconductor device of a second embodiment of the present invention.

At first, as shown in FIG. 7A, device isolation regions 2 are formed on one principal surface of a p-type silicon substrate 1 by, for example, a shallow trench isolation (STI) method, and a device forming region is defined by the device isolation regions 2. Next, a polycrystal silicon film and a silicon oxide film are deposited in succession on a gate insulating film 3 made of silicon oxide provided on the surface of the device forming region. A gate pattern is formed with resist (not shown), and the silicon oxide film is etched to form a hard mask 5. After the resist has been peeled off, the polycrystal silicon film is etched while being masked with the hard mask 5 to form a gate electrode 4.

Although polycrystal silicon is used as the material of the gate electrode 4, amorphous silicon, amorphous silicon germanide, polycrystal silicon germanide or the like may be used. Furthermore, the gate electrode 4 may be doped in n-type with phosphorus, arsenic, antimony, or the like. In the case of a p-type device, the gate electrode may be doped in p-type with boron, boron fluoride, or the like. Furthermore, metallic material having a melting point of more than 1200° C. such as tungsten, titanium nitride, or tantalum nitride may be used instead of the polycrystal silicon.

The gate insulating film 3 may be made of any other material as long as it has an insulating performance, but is preferably made of material such as silicon oxynitride or silicon nitride which is resistant to diffusion of an impurity such as cesium to become fixed charges. The gate insulating film 3 may also preferably be made of a material having a larger dielectric constant than silicon oxide. Materials having a larger dielectric constant than silicon oxide may be, for example, hafnium oxide, zirconium oxide, aluminum oxide, tantalum oxide, hafnium oxynitride, zirconium oxynitride, aluminum oxynitride, or tantalum oxynitride, or may be a material having a complex composition of them (e.g., hafnium oxide aluminate, hafnium oxynitride aluminate, or the like), or a material which contains an element, such as silicon, contained in the semiconductor substrate (e.g., hafnium oxide silicate, hafnium oxide aluminate silicate, or the like). The gate insulating film 3 may also be a laminated film of a silicon oxide film and a film having a larger dielectric constant than silicon oxide, or a laminated film of a silicon oxynitride film and a film having a larger dielectric constant than silicon oxide. In the case of such laminated films, the carrier mobility can be prevented from deteriorating by using the silicon oxide film or the silicon oxynitride film as a layer which comes into contact with the silicon substrate.

Figure 7B:
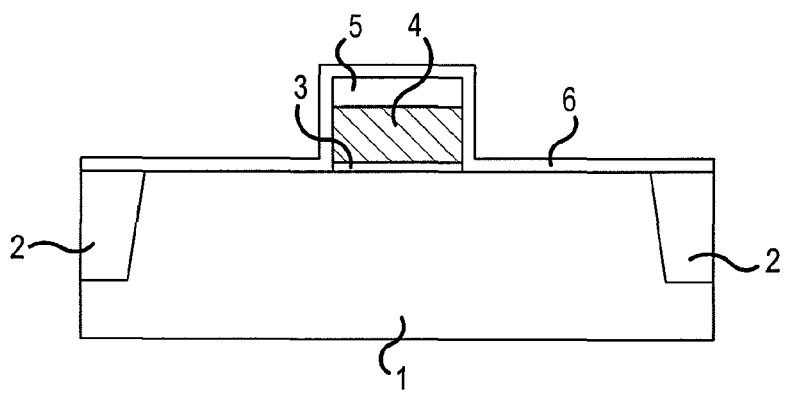

Next, as shown in FIG. 7B, a silicon oxide film 6 is formed on the whole surface of the substrate using, for example, a CVD method.

After forming the silicon oxide film 6, annealing at a temperature of the order of 600° C. to 1200° C. may be carried out in an oxygen-containing atmosphere. By this annealing, the silicon oxide film grows toward the silicon substrate 1, and the interface between the silicon oxide film 6 and the silicon substrate 1 is formed in a deeper position than the interface between the gate insulating film 3 and the silicon substrate 1. At this moment, the capacitance between the gate electrode and the fixed charges can be less than the capacitance between the silicon substrate and the fixed charges, so that the electric lines of force extending from the fixed charges are restrained from terminating at the gate electrode 4, and thus it becomes possible that the electric lines of force terminate at the silicon substrate 1 efficiently. Consequently, the source and drain extensions consisting of low resistance inversion layers can be formed.

Furthermore, it is preferable that the thickness of the silicon oxide film 6 is more than the thickness of the gate insulating film 3. Because of this, the cross-sectional area of the gate insulating film 3 viewed from the impurity to become fixed charges, such as cesium, contained in the silicon oxide film is reduced. Therefore, it is possible to suppress such impurity entering into the gate insulating film 3 in a later thermal diffusion process. Thus, the distribution of the impurity such as cesium to become fixed charges can be easily controlled.

Figure 7C:
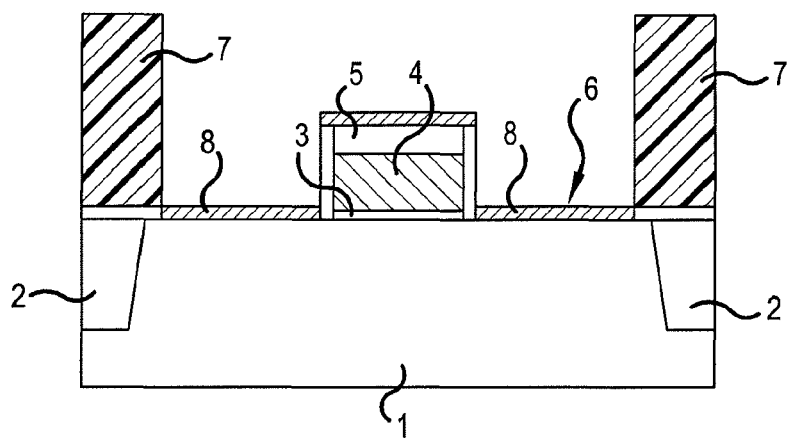

Next, as shown in FIG. 7C, resist is applied to the surface of the silicon substrate 1, and then a resist mask 7 is formed by carrying out patterning such that the device isolation regions 2 are covered and part or the whole of the device forming region is exposed. After that, ion implantation of cesium into the silicon oxide film 6 is carried out using the gate electrode 4 and the resist mask 7 as masks.

After that, annealing at a temperature of the order of 700° C. to 1000° C. is carried out for a period of the order of 1 second to 100 minutes in, for example, a nitrogen atmosphere. By the annealing, the cesium is diffused in the silicon oxide film 6, and is segregated near the interface between the silicon oxide film 6 and the silicon substrate 1, so that the fixed charges can be distributed to positions as close to the silicon substrate 1 as possible. Furthermore, since the capacitance between the cesium and the silicon substrate becomes very large, the potential fluctuation of the cesium caused by the ionization of it becomes very small, and thereby the ionization rate of the cesium increases. Consequently, high density fixed-charge containing regions 8 can be formed. The fixed-charge containing regions 8 are formed in positions self-aligned with respect to the gate electrode 4.

Furthermore, when the interfaces between the fixed-charge containing regions 8 of the silicon oxide film 6 and the silicon substrate 1 are formed in deeper positions than the interface between the gate insulating film 3 and the silicon substrate 1, the capacitance between the gate electrode and the fixed charges can be less than the capacitance between the silicon substrate and the fixed charges, so that the electric lines of force extending from the fixed charges are restrained from terminating at the gate electrode 4, and thus it becomes possible that the electric lines of force terminate at the silicon substrate 1 efficiently. Consequently, the source and drain extensions consisting of low resistance inversion layers can be formed.

In addition, as compared with the ionic radii of lithium, sodium, and potassium, of which atoms are known to become movable ions in a silicon oxide film, the ionic radius of cesium is very large, so that cesium atoms are less apt to become movable ions at an ordinary device operating temperature, thereby functioning as steady fixed charges.

Instead of cesium described above, at least one of rubidium, barium, and strontium may be used, or at least two of cesium, rubidium, barium, and strontium may be used.

Band bending arises at surface portions of the silicon substrate 1 under the positive fixed charges by the electrical field emitted from the positive fixed charges. When the potential of the surface of the silicon substrate 1 reaches about twice as large as the difference between the Fermi potential of the silicon substrate 1 and the intrinsic Fermi potential, inversion layers are formed at the surface portions of the silicon substrate 1 under the positive fixed charges.

After forming the silicon oxide film 6 and before the ion implantation, a silicon nitride film as an example of the second insulating layer may be formed on the whole surface of the silicon substrate (wafer). By forming the silicon nitride film before an impurity such as cesium to become fixed charges is implanted into the silicon oxide film 6, it is possible to prevent thermal diffusion of the impurity to the opposite side away from the silicon substrate caused by heat treatment, etc. in a process subsequent to the implantation of the impurity. The silicon nitride film may be replaced with any material as long as the material is resistant to diffusion of an impurity such as cesium. In this case, ion implantation of cesium into the silicon oxide film 6 is carried out beyond the silicon nitride film, so that it is preferable that the thickness of the silicon nitride film is one-half or less of the thickness of the silicon oxide film 6. For example, when the thickness of the silicon oxide film 6 is between 350 Å (35 nm) and 500 Å (50 nm) inclusive, if the thickness of the silicon nitride film is 100 Å (10 nm), and the implantation energy for the cesium ions is about 30 keV to 50 keV, the implanted cesium ions can be distributed near the center of the silicon oxide film 6 in the direction of its thickness with very few ions entering the silicon substrate.

Figure 7D:
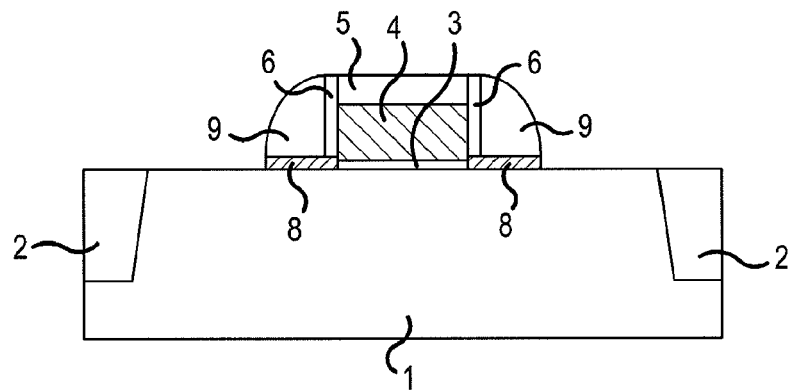

Next, as shown in FIG. 7D, the resist mask 7 (shown in FIG. 7C) is peeled off, and then a silicon oxide film is deposited to a desired thickness by a CVD method. After that, gate sidewalls 9 are formed by etching back the silicon oxide film by an RIE method. As a result, the silicon substrate 1 is exposed in self-alignment with respect to the gate electrode 4. The silicon oxide film may be replaced with a film made of any material as long as the film has an insulating performance, but the film is preferably made of a material such as silicon oxynitride or silicon nitride which is resistant to diffusion of an impurity to become fixed charge, such as cesium.

Figure 7E:
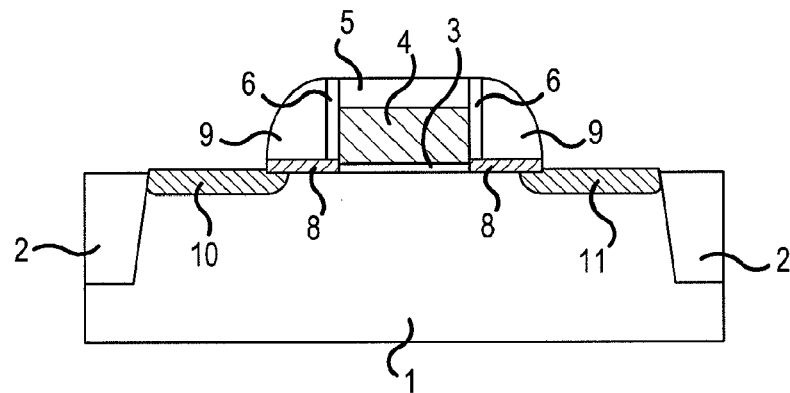

Next, as shown in FIG. 7E, after a metallic material is deposited, annealing is carried out in, for example, a nitrogen atmosphere to form metallic silicide, and then a source region 10 and a drain region 11 made of the metallic silicide, which exemplify the electrically conductive region, are formed by removing unreacted metallic material by wet etching. Between the metal silicide and the silicon substrate 1, Schottky barriers are formed. Since the silicon substrate 1 has been exposed in a self-aligned manner with respect to the gate electrode 4, the source region 10 and the drain region 11 are formed in positions self-aligned with respect to the gate electrode 4. Since no lithography process is used, discrepancy in alignment which would be caused by the lithography process is avoided. In addition, the fixed-charge containing regions 8 are also positioned in self-alignment with respect to the source region 10 and drain region 11, and thereby a device characteristic with a small variation can be realized.

As the metallic material, for example, Ti, Co, Ni, Pb, Pt, Er, Yb, or the like may be used. In particular, by using Er or Yb in the case of an n-type device, and by using Pt in the case of a p-type device, metallic silicide having a low Schottky barrier can be formed. Consequently, the resistances between the inversion layers and the metallic silicide can be made extremely small, thus increasing the ON-state current of the device.

In the case that the gate electrode 4 is made of polycrystal silicon, the hard mask 5 may be removed before the metallic material is deposited such that in a salicide process, part or the whole of the gate electrode 4 is silicified and at the same time the source region 10 and the drain region 11 are formed.

Figure 7F:
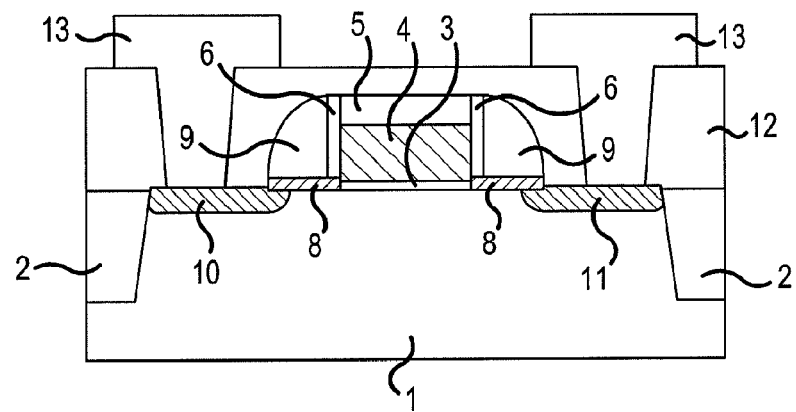

Next, as shown in FIG. 7F, interlayer dielectrics 12, upper wirings 13, etc. are formed by a publicly known method, and then the semiconductor device is completed.

Figure 8:
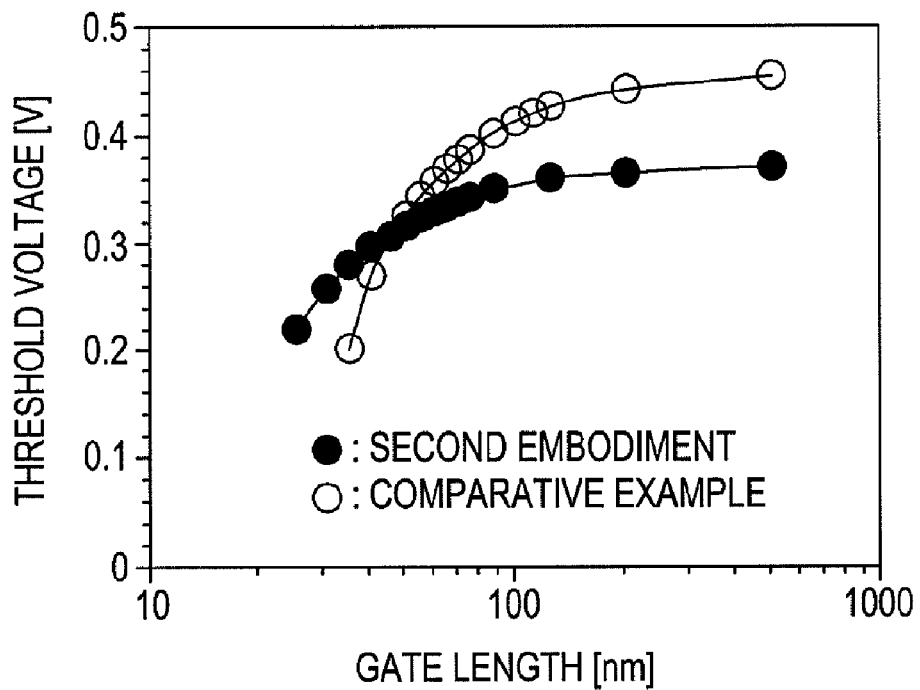
FIG. 8 shows the gate length dependence of the threshold voltage of the semiconductor device (n-type channel device) shown in FIG. 7F.

FIG. 8 shows the gate length dependence of the threshold voltage of the semiconductor device (n-type channel device) of the second embodiment, which was made using $CoSi_2$ as the metallic silicide under the condition that the equivalent oxide thickness of the gas insulating film was 2 nm, and that the power supply voltage was 1.2 V. In FIG. 8, in addition to the result of the semiconductor device of the second embodiment, the result of a MIS field-effect transistor (a comparative example) having an ordinary structure made in accordance with a similar design rule is shown. As can be seen from FIG. 8, the semiconductor device of the second embodiment has a low dependence of the threshold voltage on the gate length, thereby controlling the short channel effect effectively.

Furthermore, under the condition that the gate length was 50 nm and the threshold voltage was about 0.3 V, the ON-state current of the semiconductor device of the second embodiment was 541 μA/μm, about 28% larger than that of the MIS field-effect transistor having an ordinary structure which was 424 μA/μm.

As can be seen from FIG. 7F, the semiconductor device of the second embodiment of the present invention is a MIS field-effect transistor having a source region 10 and a drain region 11 made of metallic silicide, and fixed-charge containing regions 8 containing fixed charges made of cesium in a silicon oxide film 6 between a gate electrode 4 and each of a source region 10 and a drain region 11.

Since the cesium near the interface between the silicon oxide film 6 and the silicon substrate 1 becomes positive fixed charge, the bands of the silicon substrate 1 are bent near the interfaces between the cesium containing regions 8 and the silicon substrate 1 to form inversion layers. In addition, due to the electrical field from the fixed charge, the heights and widths of the Schottky barriers between the source region 10 and drain region 11 and the silicon substrate 1 are small near the interface between the silicon oxide film 6 and the silicon substrate 1. Consequently, the inversion layers are connected to the source region 10 and the drain region 11 so as to have low resistances therebetween.

As understood from the above description, the source region 10 and the drain region 11 are made of low resistance metallic silicide, and the Schottky barriers are modulated by the fixed charge, so that the parasitic resistance of the device can be significantly small. In addition, the inversion layers formed under the fixed-charge containing regions 8 function as extremely shallow source and drain extensions, so that the short channel effect can be controlled effectively. Furthermore, whereas the source region and the drain region of ordinary MIS field-effect transistors are made using impurity diffusion layers, the source region 10 and the drain region 11 of the semiconductor of the second embodiment are made using metallic silicide, so that in the embodiment, it is easy to form the source region 10 and the drain region 11 at shallow depths, and thus the short channel effect can be controlled effectively. Consequently, an extremely high performance MIS field-effect transistor can be provided.

In this connection, forming an inversion layer requires a fixed-charge density $\sigma_{fc}$ [cm$^{-2}$] satisfying the condition of:

$$\sigma_{fc} > \sqrt{\frac{2\varepsilon_0 \kappa_{Si} N_A}{q}(2\phi_B + V_R)}$$

Furthermore, the first ionization energy of a material used instead of cesium is preferably less than the electron affinity of the semiconductor substrate. For example, when a silicon substrate is used as the semiconductor substrate, if a substitute material for cesium has a first ionization energy less than the electron affinity (4.15 eV) of silicon, high density positive fixed charge can be obtained.

Furthermore, in the case of a p-type device, a material having an electronic affinity or a work function larger than the sum of the electron affinity and the band gap of the semiconductor substrate is preferably used as a material for generating fixed charge. For example, when a silicon substrate is used as the semiconductor substrate, use of a material having an electronic affinity or a work function larger than the sum (5.25 eV) of the electron affinity (4.15 eV) and band gap (1.1 eV) of silicon allows high density negative fixed charge to be obtained.

Figure 9:
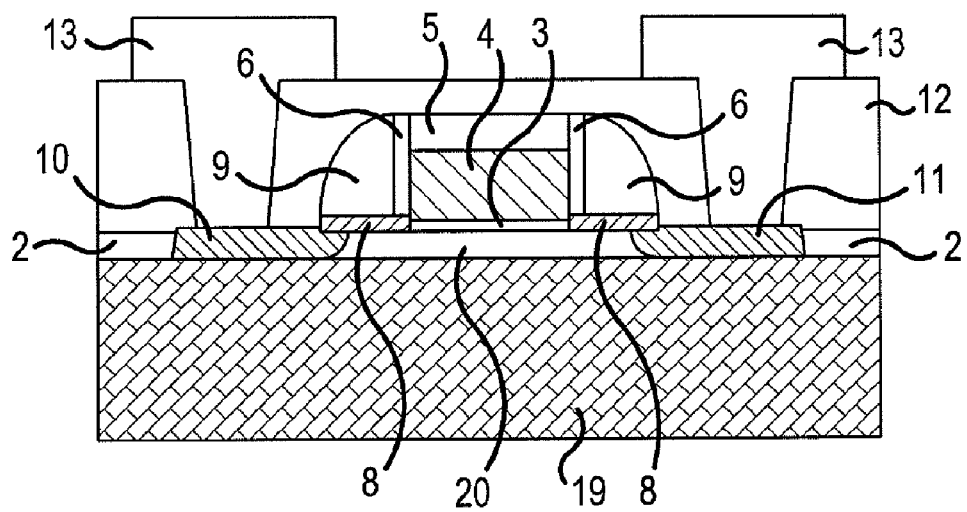
FIG. 9 is a cross-sectional view of a semiconductor device manufactured using a SOI substrate instead of the silicon substrate of the semiconductor device shown in FIG. 7F.

FIG. 9 is a cross-sectional view of a semiconductor device manufactured using a SOI substrate instead of the silicon substrate 1 shown in FIG. 7F. Since the source region 10 and the drain region 11 are in contact with the buried oxide film 19 as an example of an insulator layer, the leakage currents and junction capacitances at the Schottky junctions can be significantly reduced. Furthermore, since there are Schottky junctions between the source region 10 and drain region 11 and the silicon layer 20, the floating body effect which becomes a problem in a MIS field-effect transistor using a SOI substrate is hard to arise. In addition, under the condition that the thickness of the silicon layer 20 is sufficiently small and the silicon layer under the fixed-charge containing regions 8 is completely depleted, the fixed charge necessary for the depletion are less than those in the case of a bulk silicon substrate, thereby increasing the carrier densities of the inversion layers.

Third Embodiment

The semiconductor device of the third embodiment of the present invention is manufactured in such a way that the position of cesium to become fixed charges is deeper than the position of the interface between the gate insulating film and the silicon substrate. Because of this, the capacitance between the gate electrode and the fixed charges can be sufficiently less than the capacitance between the silicon substrate and the fixed charges, so that the electric lines of force extending from the fixed charges are restricted from terminating at the gate electrode 4, and thereby it becomes possible that the electric lines of force terminate at the silicon substrate efficiently. Thus, the heights and widths of the Schottky barriers are modulated effectively, and the carrier densities of the inversion layers formed with the fixed charge are increased, and thereby the parasitic resistance is reduced and a larger drive current is obtained.

FIGS. 10A to 10F are cross-sectional views of the semiconductor device of the third embodiment of the present invention in the manufacturing processes illustrating the manufacturing method of it.

Figure 10A:
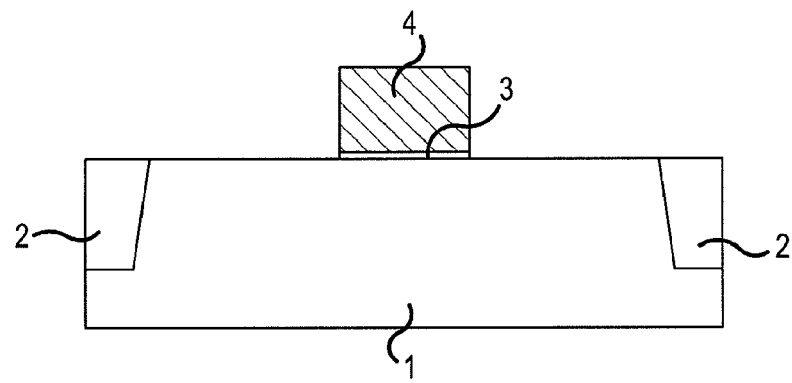
FIGS. 10A, 10B, 10C, 10D, 10E, and 10F show the processes of manufacturing a semiconductor of a third embodiment of the present invention.

At first, as shown in FIG. 10A, device isolation regions 2 are formed on one principal plane of a p-type silicon substrate (wafer) 1 by, for example, a shallow trench isolation (STI) method, and the device forming region is defined by the device isolation regions 2. Next, a polycrystal silicon film is deposited on a gate insulating film 3 made of silicon oxide provided on the surface of the device forming region, and then patterned to thereby form a gate electrode 4. The gate insulating film 3 may be of any other material as long as it has an insulating performance, but is preferably made of a material such as silicon oxynitride or silicon nitride in which an impurity, such as cesium, to become fixed charges hardly diffuses. Furthermore, although polycrystal silicon is used for the gate electrode 4 in this embodiment, amorphous silicon, amorphous silicon germanide, polycrystal silicon germanide or the like may be used. Furthermore, the gate electrode 4 may be doped in n-type with phosphorus, arsenic, antimony, or the like. In the case of a p-type device, the gate electrode may be doped in p-type with boron, boron fluoride, or the like.

Figure 10B:
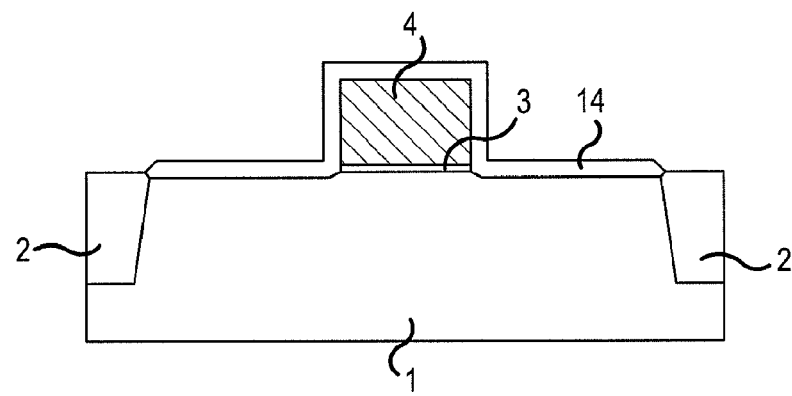

Next, as shown in FIG. 10B, the whole surface of the silicon substrate 1 is oxidized to form a silicon oxide film 14. Since the silicon oxide film 14 is formed by the reaction of the silicon substrate 1 and oxygen, the interface between the silicon oxide film 14 and the silicon substrate 1 is formed in a deeper position than the interface between the gate insulating film 3 and the silicon substrate 1.

The silicon oxide film 14 may be formed by annealing at a temperature of the order of 800° C. to 1000° C. in, for example, an oxygen atmosphere. Furthermore, after the silicon oxide film 14 has been formed, part or the whole of the silicon oxide film 14 may be nitrided by annealing in an atmosphere which contains at least one of nitrogen, nitrogen monoxide, dinitrogen monoxide, nitrogen radical, and ammonia. Also, silicon oxide may be additionally deposited by, for example, a CVD process to allow independent control of the thickness of the silicon oxide film 14 and the position of the interface between the silicon oxide film 14 and the silicon substrate 1.

Figure 10C:
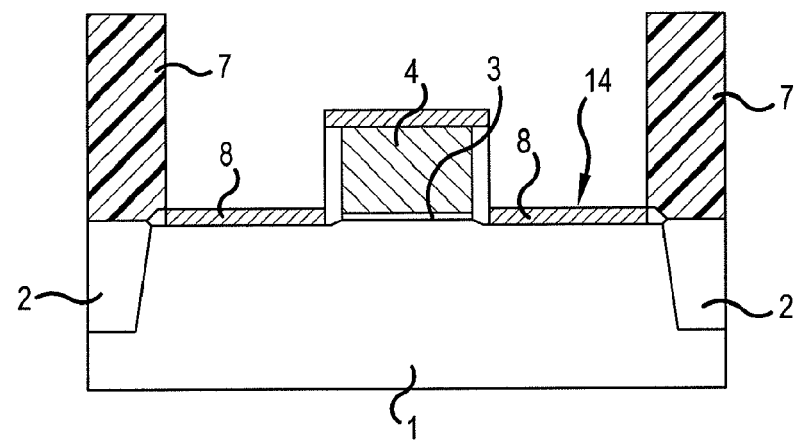

Next, as shown in FIG. 10C, resist is applied to the surface of the silicon substrate 1, and then a resist mask 7 is formed by patterning such that the device isolation regions 2 are covered and part or the whole of the device forming region is exposed. After that, ion implantation of cesium into the silicon oxide film 14 is carried out using the gate electrode 4 and the resist masks 7 as masks. Since the first ionization energy of cesium is as small as 3.89 eV, the outermost-shell electrons of cesium move toward the silicon substrate 1, and thereby high-density positive fixed-charge containing regions 8 are obtained.

Figure 10D:
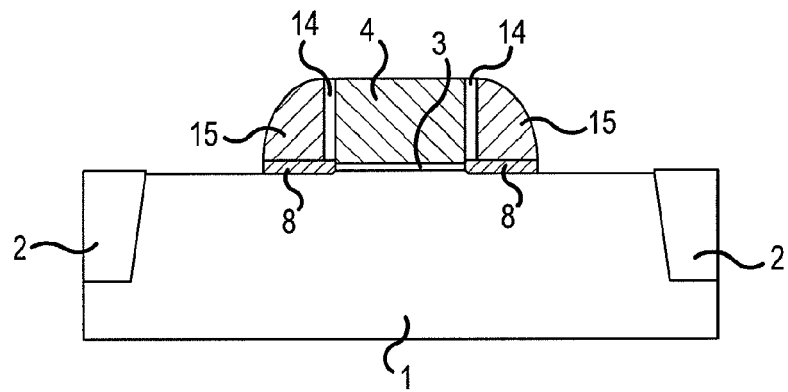

Next, as shown in FIG. 10D, the resist masks 7 (shown in FIG. 10C) is peeled off, and then a silicon nitride film is deposited to a desired thickness by a CVD method, and gate sidewalls 15 are formed by etching back the silicon nitride film by an RIE method.

Figure 10E:
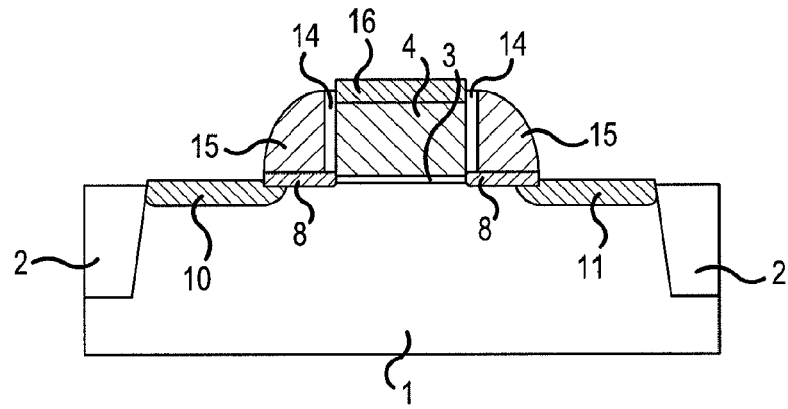

Next, as shown in FIG. 10E, a source region 10 and a drain region 11 of metallic silicide, which exemplify the electrically conductive region, are formed by a salicide process. Schottky junctions are formed between the metallic silicide and the silicon substrate. At this moment, a polycide 16 is formed on the top of the gate electrode 4.

As metallic material for the metallic silicide, for example, Ti, Co, Ni, Pb, Pt, Er, Yb, or the like may be used. In particular, by using Er or Yb in the case of an n-type device, or by using Pt in the case of a p-type device, metallic silicide having a low Schottky barrier can be formed, and consequently the low resistance contact is realized, thereby increasing the ON-state current of the device.

After that, annealing at a temperature of the order of 700° C. to 1000° C. is carried out for a period of the order of 1 second to 100 minutes in, for example, a nitrogen atmosphere. By the annealing, the cesium is diffused in the silicon oxide film 14, and is segregated near the interface between the silicon oxide film 14 and the silicon substrate 1, becoming positive fixed charge. At this moment, the capacitance between the cesium and the silicon substrate becomes very large, so that the potential fluctuation of the cesium caused by the ionization of it becomes very small, and consequently the ionization rate of the cesium increases, thus forming high density fixed charge. Since the cesium is hard to diffuse in the gate sidewalls 15 made of silicon nitride, out-diffusion of the cesium caused by the annealing can be prevented.

Furthermore, the interfaces between the fixed-charge containing regions 8 of the silicon oxide film 14 and the silicon substrate 1 are formed in deeper positions than the interface between the gate insulating film 3 and the silicon substrate 1, so that the distance between the segregated cesium and the gate electrode 4 increases accordingly, thereby reducing the proportion of electric lines of force which terminate at the gate electrode to the electric lines of force extending from the ionized cesium. Consequently, the effect of modulation of the heights and widths of the Schottky barriers can be obtained more efficiently, and the carrier densities of the inversion layers induced by the fixed charges increase, so that the resistance value can be reduced accordingly.

Figure 10F:
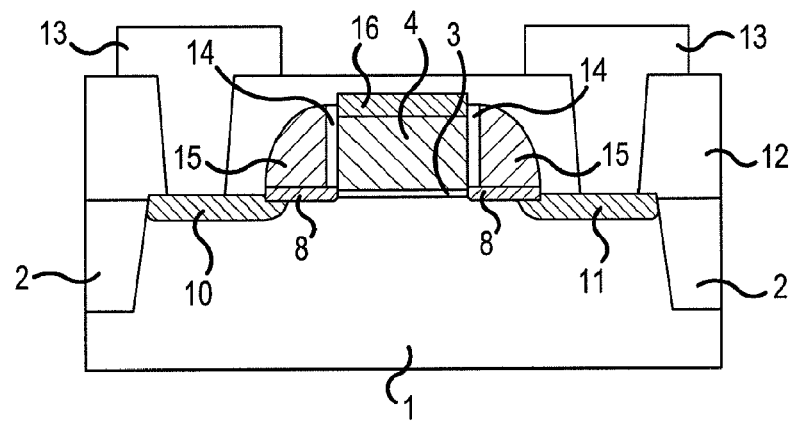

Next, as shown in FIG. 10F, interlayer dielectrics 12, upper wirings 13, etc. are formed by a publicly known method, as a result of which the semiconductor device is completed.

Figure 11:
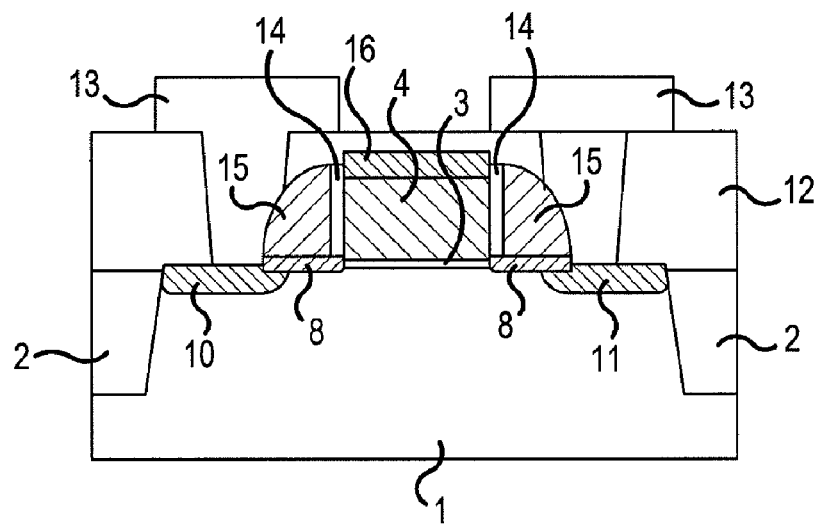
FIG. 11 is a cross-sectional view of a semiconductor device obtained when a SAC process is used for the semiconductor device shown in FIG. 10F.

The device area can be reduced using a self-aligned contact (SAC) process as shown in FIG. 11 instead of the method shown in FIG. 10F. In other words, the alignment margin between each of the source region 10 and drain region 11 and the contact hole can be reduced, so that the areas of the source region 10 and the drain region 11 can be reduced. Consequently, the parasitic capacitance can also be reduced, and the operation speed of the device can be increased.

As can be seen from FIG. 10F and FIG. 11, in the semiconductor device of the third embodiment of the present invention, the interface between the silicon oxide film 14 and the silicon substrate 1 is formed in a deeper position than the interface between the gate insulating film 3 and the silicon substrate 1.

Figure 12:
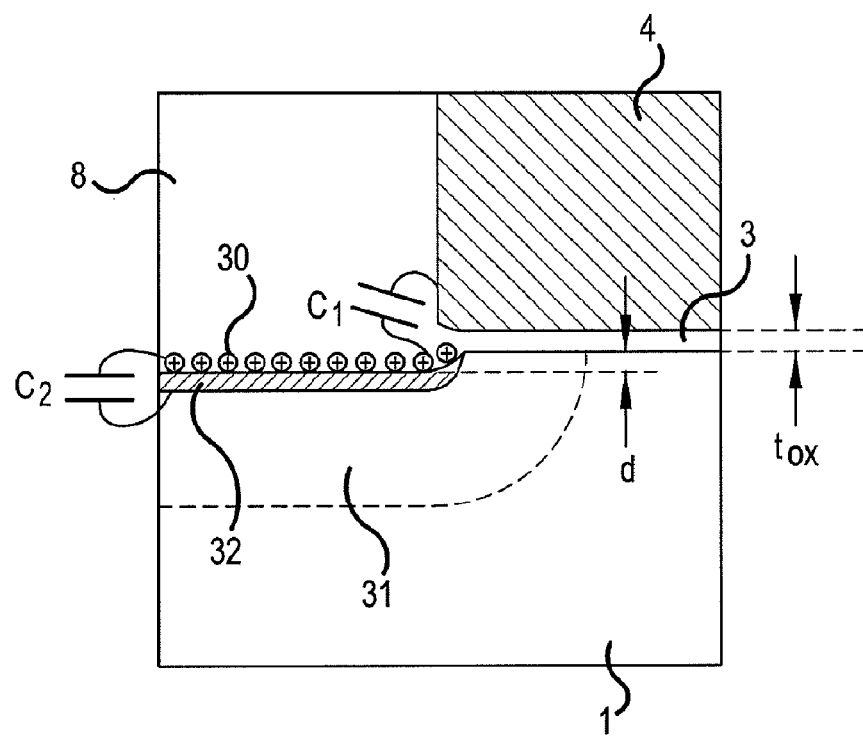
FIG. 12 is an enlarged view of an area of a source electrode side end of the gate electrode 4 in FIG. 10F.
Figure 13:
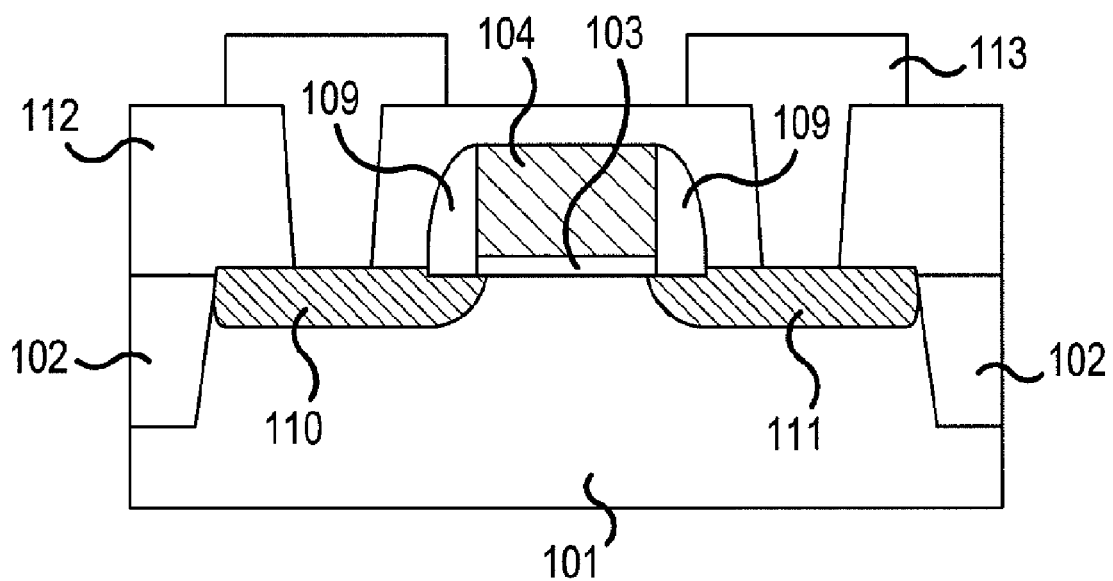
FIG. 13 is a cross-sectional view of a background art SB-MISFET.

The structural superiority of the semiconductor device of the third embodiment of the present invention will be described with reference to FIG. 12.

A state in which an inversion layer has been formed by fixed charges will be discussed below. FIG. 12 is an enlarged view of a region near the source electrode side end of the gate electrode 4 in FIG. 10F. In FIG. 12, the capacitance between the gate electrode 4 and the fixed charges 30 near the end of the gate electrode is $C_1$ [F/cm$^2$], and the effective capacitance between the fixed charges 30 and the inversion layer 32 is $C_2$ [F/cm$^2$], where the potential of the gate electrode 4 is V [V], and the potential of the silicon substrate 1 is 0 [V]. When the thickness of the gate insulating film 3 (in terms of EOT) is $t_{ox}$ [cm], the depth of the interface between the fixed-charge containing region 8 and the silicon substrate 1 measured from the interface between the gate insulating film 3 and the silicon substrate 1 is d [cm], and the effective thickness of the inversion layer 32 is $t_{inv}$ [cm], the following relations are obtained near the source electrode side end of the gate electrode:

$$C_1 = \frac{\varepsilon_0 \kappa_{SiO_2}}{(t_{ox} + d)}$$

$$C_2 = \frac{\varepsilon_0 \kappa_{Si}}{t_{inv}}$$

When the fixed-charge density is $Q_{FC}$ [C/cm$^2$], the density of charges induced in the gate electrode 4 is $-Q_1$ [C/cm$^2$], the density of charges induced in the silicon substrate is $-Q_2$ [C/cm$^2$], the voltage applied to the gate electrode is V [V], the potential of the fixed charge 30 is $V_{FC}$ [V], and the flat band voltage between the gate electrode 4 and the silicon substrate 1 is $V_{FB}$ [V] (<0), the following equations are obtained, $$Q_{FC} = Q_1 + Q_2$$

$$Q_1 = C_1(V_{FC} - V + V_{FB})$$

$$Q_2 = Q_{inv} + Q_B$$

$$Q_{inv} = C_2(V_{FC} - 2\phi_B)$$

$$Q_B = \sqrt{2\varepsilon_0 \kappa_{Si} \phi_B q N_A}$$

where $Q_{inv}$ [C/cm$^2$] is the charge density of the inversion layer 32, $Q_B$ [C/cm$^2$] is the space charge density in the depletion layer 31, and $N_A$ [cm$^{-3}$] is the impurity concentration of the silicon substrate 1 which is assumed to be constant (p-type). According to the above equations, $Q_{inv}$ is given by the following equation.

$$Q_{inv} = \frac{C_2}{C_1 + C_2} \{Q_{FC} - Q_B + C_1(V - V_{FB} - 2\varphi_B)\}$$

$C_1(V-V_{FB}-2\phi_B)$ in the above equation is equivalent to the density of charges caused by the electrical field which has leaked out of the gate electrode 4. In other words, it is equivalent to the density of charges stored in a fringe capacitor which is parasitic on the gate electrode. Because of this, it is preferably set to a small value.

When $Q_{FC}$ is sufficiently large, $Q_{inv}$ may be approximated as:

$$Q_{inv} = \frac{C_2}{C_1 + C_2} Q_{FC}$$

As can been seen, when d is designed to be large enough to reduce $C_1$, the charge density $Q_{inv}$ of the inversion layer 32 increases, and a lower-resistance inversion layer 32 is thus obtained. At the same time, the fringe capacitance can also be reduced. Consequently, a higher operation speed of the device, a lower power consumption, etc. can be realized.

For example, when $C_1/C_2=1/\alpha$, $$d = \frac{\kappa_{SiO_2}}{\kappa_{Si}} t_{inv} \alpha - t_{ox}$$

is given. When $t_{ox}=2$ [nm] and $\alpha=12$, d=2 [nm], where $t_{inv}=1$ [nm] is assumed, and $\kappa_{SiO_2}=3.9$ and $\kappa_{Si}=1.17$ are used.

In the semiconductor device (n-type channel device) of the third embodiment made using $CoSi_2$ as metallic silicide under the condition that the gate length was 50 nm, that the equivalent oxide thickness of the gate insulating film was 2 nm, that the power supply voltage was 1.2 V, and that d=2.2 [nm], the ON-state current was 570 µA/µm which was about 5% larger than that in the case of d≈0 [nm]. Like this, by setting the value of d to one to several times the value of $t_{ox}$, the device characteristic can be improved without almost deteriorating the short channel effect.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
    a semiconductor;
    an electrically conductive region which is in contact with the semiconductor to form a Schottky junction; and
    an insulator which is in contact with the semiconductor and the electrically conductive region, and has a fixed-charge containing region which contains a fixed charges and extends across a boundary between the semiconductor and the electrically conductive region,
    wherein the fixed charges are provided at and/or adjacent to an interface between the insulator and the semiconductor and between the insulator and the electrically conductive region.

2. A semiconductor device as claimed in claim 1, further comprising
    a gate electrode, and wherein:
    the electrically conductive region includes a source region and a drain region provided on one principal plane of the semiconductor and spaced from each other;
    the insulator includes a gate insulating film under the gate electrode and a first insulating layer provided on opposite sides of the gate insulating film in such a manner that the first insulating layer overlaps the source region and the drain region;
    the fixed-charge containing region is contained in opposite end portions of the gate insulating film and portions of the first insulating layer adjacent to those opposite end portions of the gate insulating film;
    the fixed charges of the insulator have a polarity equivalent to a conductivity type of the semiconductor; and
    the gate electrode is provided, via the gate insulating film, on a channel region of the semiconductor between the source region and the drain region as well as on a portion near the channel region of at least one of the source region and the drain region.

3. A semiconductor device as claimed in claim 2, wherein an interface between the fixed-charge containing region of the first insulating layer and the semiconductor is provided in a semiconductor-side deeper position than an interface between the gate insulating film and the semiconductor.

4. A semiconductor device as claimed in claim 2, wherein:
    the fixed charges are constituted by a substance; and
    the semiconductor device further comprises a second insulating layer on the fixed-charge containing region of the first insulating layer, said second insulating layer being made of a substance in which the substance constituting the fixed charges is less heat-diffusible than in the first insulating layer.

5. A semiconductor device as claimed in claim 2, wherein:
    the fixed charges are constituted by a substance; and
    the gate insulating film is made of a material which is resistant to thermal diffusion of the substance constituting the fixed charges of the first insulating layer.

6. A semiconductor device as claimed in claim 2, wherein the fixed-charge containing region of the first insulating layer has a thickness larger than a thickness of the gate insulating film.

7. A semiconductor device as claimed in claim 1, further comprising a gate electrode having two opposed side surfaces, and wherein:
    the electrically conductive region includes a source region and a drain region provided on one principal plane of the semiconductor and spaced from each other;
    the insulator includes a gate insulating film under the gate electrode and a first insulating layer provided on both sides of the gate insulating film in such a manner that the first insulating layer overlaps the source region and the drain region;
    the fixed charges of the insulator have a polarity equivalent to a conductivity type of the semiconductor; and
    the fixed-charge containing region is contained in at least the first insulating layer such that the fixed-charge containing region extends at least from each of positions corresponding to the side surfaces of the gate electrode to a position on each of the source and drain regions.

8. A semiconductor device as claimed in claim 7, wherein an interface between the fixed-charge containing region of the first insulating layer and the semiconductor is provided in a semiconductor-side deeper position than an interface between the gate insulating film and the semiconductor.

9. A semiconductor device as claimed in claim 7, wherein:
the fixed charges are constituted by a substance; and
the semiconductor device further comprises a second insulating layer on the fixed-charge containing region of the first insulating layer, said second insulating layer being made of a material in which the substance constituting the fixed charges is less heat-diffusible than in the first insulating layer.

10. A semiconductor device as claimed in claim 7, wherein:
the fixed charges are constituted by a substance; and
the gate insulating film is made of a material which is resistant to thermal diffusion of the substance constituting the fixed charges of the first insulating layer.

11. A semiconductor device as claimed in claim 7, wherein the fixed-charge containing region of the first insulating layer, has a thickness larger than a thickness of the gate insulating film.

12. A semiconductor device as claimed in claim 1, wherein the semiconductor is provided on an insulator layer.

13. A semiconductor device as claimed in claim 12, wherein the electrically conductive region is in contact with the insulator layer.

14. A semiconductor device as claimed in claim 1, wherein the electrically conductive region is made of a compound of the semiconductor and, metal.

15. A semiconductor device as claimed in claim 14, wherein the metal is any one of tungsten, titanium, cobalt, nickel, and palladium.

16. A semiconductor device as claimed in claim 14, wherein the semiconductor has a conductivity type of p-type, and the metal is any one of erbium and ytterbium.

17. A semiconductor device as claimed in claim 14, wherein the semiconductor has a conductivity type of n-type, and the metal is platinum.

18. A semiconductor device as claimed in claim 1, wherein the semiconductor has a conductivity type of p-type, and at least one element of cesium, rubidium, barium, and strontium constitutes the fixed charges.

19. A semiconductor device as claimed in claim 1, wherein the semiconductor has a conductivity type of n-type, and at least one element of iodine, aluminum, platinum, and selenium constitutes the fixed charges.

20. A semiconductor device as claimed in claim 1, wherein the insulator has a fixed charge density ranging from $5 \times 10^{12}$ cm$^{-2}$ to $5 \times 10^{13}$ cm$^{-2}$.

21. A semiconductor device as claimed in claim 1, wherein the electrically conductive region is a source region or a drain region.

22. A semiconductor device, comprising:
a semiconductor;
an electrically conductive region which is in contact with the semiconductor to form a Schottky junction; and
an insulator which is in contact with the semiconductor and the electrically conductive region, and has a fixed-charge containing region which contains a fixed charge and extends across a boundary between the semiconductor and the electrically conductive region,
wherein an inversion layer induced by the fixed, charge is formed in a surface region of the semiconductor under the fixed-charge containing region.

23. A semiconductor device as claimed in claim 22, wherein the electrically conductive region is a source region or a drain region.

24. A semiconductor device, comprising:
a semiconductor;
an electrically conductive region which is in contact with the semiconductor to form a Schottky junction; and
an insulator which is in contact with the semiconductor and the electrically conductive region, and has a fixed-charge containing region which contains a fixed charge and extends across a boundary between the semiconductor and the electrically conductive region,
wherein an accumulation layer induced by the fixed charge is formed in a surface region of the semiconductor under the fixed-charge containing region.

25. A semiconductor device as claimed in claim 24, wherein the electrically conductive region is a source region or a drain region.

26. A semiconductor device, comprising:
a semiconductor;
an electrically conductive region which is in contact with the semiconductor to form a Schottky junction;
an insulator which is in contact with the semiconductor and the electrically conductive region, and has a fixed-charge containing region which contains a fixed charge and extends across a boundary between the semiconductor and the electrically conductive region; and
a gate electrode,
wherein the insulator has another, region that includes no fixed-charge containing region and adjoins the fixed-charge containing region, said another region of the insulator being in contact with both the gate electrode and the semiconductor.

27. A semiconductor device as claimed in claim 26, wherein the electrically conductive region is a source, region or a drain region.

28. A semiconductor device, comprising:
a semiconductor;
an electrically conductive region which is in contact with the semiconductor to form a Schottky junction;
an insulator which is in contact with the semiconductor and the electrically conductive region, and has a fixed-charge containing region which contains a fixed charge and extends across a boundary between the semiconductor, and the electrically conductive region; and
a gate electrode,
wherein the insulator is in contact with the Schottky junction,
wherein the fixed-charge containing region covers at least a portion of a first side of the gate electrode and at least a portion of a second side of the gate electrode, and
wherein the first side of the gate electrode is a different side than the second side of the gate electrode.

29. A semiconductor device as claimed in claim 28, wherein the electrically conductive region is a source region or a drain region.

* * * * *